US012181936B2

(12) United States Patent
Yeo et al.

(10) Patent No.: US 12,181,936 B2
(45) Date of Patent: Dec. 31, 2024

(54) ELECTRONIC DEVICE INCLUDING ELECTROSTATIC DISCHARGE PATH

(71) Applicant: SAMSUNG ELECTRONICS CO., LTD., Suwon-si (KR)

(72) Inventors: Donghyeon Yeo, Suwon-si (KR); Heedong Lee, Suwon-si (KR); Minjun Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/934,484

(22) Filed: Sep. 22, 2022

(65) Prior Publication Data
US 2023/0051139 A1 Feb. 16, 2023

Related U.S. Application Data

(63) Continuation of application No. PCT/KR2022/011830, filed on Aug. 9, 2022.

(30) Foreign Application Priority Data

Aug. 10, 2021 (KR) .................. 10-2021-0105267

(51) Int. Cl.
*G06F 1/16* (2006.01)
*H05K 1/05* (2006.01)
(Continued)

(52) U.S. Cl.
CPC .......... *G06F 1/1684* (2013.01); *G06F 1/1637* (2013.01); *H05K 1/05* (2013.01);
(Continued)

(58) Field of Classification Search
CPC .... G06F 1/1626; G06F 1/1637; G06F 1/1656; G06F 1/1658; G06F 1/1684; H05K 1/09;
(Continued)

(56) References Cited

U.S. PATENT DOCUMENTS

2005/0110916 A1  5/2005  Park et al.
2010/0079692 A1  4/2010  Hwang et al.
(Continued)

FOREIGN PATENT DOCUMENTS

JP  2009111494 A  5/2009
JP  2010035046 A  2/2010
(Continued)

OTHER PUBLICATIONS

Office Action dated Aug. 21, 2023, in connection with Korean Patent Application No. 10-2021-01105267, 11 pages.
(Continued)

*Primary Examiner* — Robin J Mishler

(57) ABSTRACT

An electronic device may include a display module, a connecting member including a bending portion connected to a display panel of the display module and extending toward a rear surface of the display module, and a protective layer formed of an insulating material to cover the bending portion, a printed circuit board disposed on a rear surface of the display module and connected to the display module by the connecting member, a frame disposed to surround at least a portion of the display module and formed of a conductive material, a side member including a first partition wall portion disposed between the frame and the display module to be spaced apart from the frame and a second partition wall portion disposed to be spaced apart from the display module and coveting at least a portion of an outer periphery of the display module.

20 Claims, 14 Drawing Sheets

(51) Int. Cl.
*H05K 1/09* (2006.01)
*H05K 1/11* (2006.01)
*H05K 1/18* (2006.01)

(52) U.S. Cl.
CPC ............... *H05K 1/09* (2013.01); *H05K 1/111* (2013.01); *H05K 1/115* (2013.01); *H05K 1/181* (2013.01)

(58) Field of Classification Search
CPC .......... H05K 1/05; H05K 1/111; H05K 1/115; H05K 1/147; H05K 1/181; H05K 2201/10128; H05K 9/00
See application file for complete search history.

(56) References Cited

U.S. PATENT DOCUMENTS

| | | |
|---|---|---|
| 2011/0050871 A1 | 3/2011 | Lee et al. |
| 2012/0327328 A1 | 12/2012 | Kim et al. |
| 2013/0083275 A1* | 4/2013 | Ai .................... G02F 1/133308 349/106 |
| 2013/0242227 A1 | 9/2013 | Zhang |
| 2014/0085836 A1 | 3/2014 | Mo et al. |
| 2016/0044815 A1 | 2/2016 | Kim et al. |
| 2016/0118712 A1* | 4/2016 | Gu ........................ H05K 5/04 343/702 |
| 2017/0048366 A1 | 2/2017 | Jeong |
| 2017/0090652 A1 | 3/2017 | Sato et al. |
| 2019/0254179 A1 | 8/2019 | Miyanaga et al. |
| 2020/0133047 A1 | 4/2020 | Isobe |
| 2022/0346241 A1* | 10/2022 | Sunwoo ................ G06F 1/1618 |

FOREIGN PATENT DOCUMENTS

| | | |
|---|---|---|
| JP | 2012114663 A | 6/2012 |
| JP | 2013070166 A | 4/2013 |
| JP | 2015050654 A | 3/2015 |
| JP | 2016086151 A | 5/2016 |
| JP | 2019106690 A | 6/2019 |
| KR | 20060078867 A | 7/2006 |
| KR | 20110024828 A | 3/2011 |
| KR | 101032440 B1 | 5/2011 |
| KR | 101137874 B1 | 4/2012 |
| KR | 10-2013-0001068 A | 1/2013 |
| KR | 20160019565 A | 2/2016 |
| KR | 20170019973 A | 2/2017 |
| KR | 20180067051 A | 6/2018 |
| KR | 101975339 B1 | 5/2019 |

OTHER PUBLICATIONS

International Search Report and Written Opinion of the International Searching Authority dated Nov. 15, 2022, in connection with International Application No. PCT/KR2022/011830, 8 pages.
Supplementary European Search Report dated Oct. 11, 2024, in connection with European Patent Application No. 22856164.3, 7 pages.

* cited by examiner

ELECTRONIC DEVICE INCLUDING ELECTROSTATIC DISCHARGE PATH

CROSS-REFERENCE TO RELATED APPLICATIONS

This application is a bypass continuation of International Application No. PCT/KR2022/011830, filed Aug. 9, 2022, which claims priority to Korean Patent Application No. 10-2021-0105267, filed Aug. 10, 2021, the disclosures of which are herein incorporated by reference in their entirety.

BACKGROUND

1. Field

Various embodiments disclosed herein relate to an electronic device including an electrostatic discharge path.

2. Description of Related Art

An electrostatic discharge (ESD) phenomenon may occur between an electronic component and electrical objects made of a conductive material. The ESD phenomenon may refer to an electrical phenomenon generated by instantaneous movement of electric charges accumulated in one portion by various factors to another portion. An ESD phenomenon may occur in electronic components due to electric charges accumulated inside or outside an electronic device. Since ESD is accompanied by a strong voltage, when the ESD phenomenon occurs in an electronic component, the electronic component may be damaged. Such damage may cause problems in which the electronic device may not function properly or the performance of the electronic device may be deteriorated.

In order to resolve the ESD phenomenon, it is becoming important to design a path for allowing ESD to flow to a ground in an electronic device.

SUMMARY

Electric charges may be accumulated on the surface of an electronic device. For example, when a user holds an electronic device or an electronic device comes into contact with an external object, electric charges may be accumulated on the surface of the electronic device.

Meanwhile, an electronic device may have a gap through which the outside and the inside of the electronic device communicate with each other according to a design. The electric charges accumulated on the surface of the electronic device may cause, through the gap, the ESD phenomenon in an electronic component disposed inside the electronic device. In this case, damage to the electronic component may occur due to the ESD phenomenon.

Various embodiments disclosed herein are able to provide an electronic device including a path through which ESD caused by electric charges accumulated in the electronic device flows out.

An electronic device according to various embodiments disclosed herein may include a display module, a connecting member including a bending portion connected to a display panel of the display module and extending toward a rear surface of the display module, and a protective layer formed of an insulating material to cover the bending portion, a printed circuit board disposed on a rear surface of the display module and connected to the display module by the connecting member, a frame disposed to surround at least a portion of the display module and formed of a conductive material, a side member including a first partition wall portion disposed between the frame and the display module to be spaced apart from the frame and a second partition wall portion disposed to be spaced apart from the display module and covering at least a portion of an outer periphery of the display module, at least one opening provided in the first partition wall portion, and a first conductive connecting member extending from the second partition wall portion to the first partition wall portion, at least a portion of the first conductive connecting member being located in the opening and at least a portion of the conductive connecting member being disposed on the side member to face the connecting member.

An electronic device according to various embodiments disclosed herein may include a display module, a connecting member including a bending portion connected to a display panel of the display module and extending toward a rear surface of the display module, and a protective layer formed of an insulating material to cover the bending portion, a printed circuit board disposed on a rear surface of the display module and connected to the display module by the connecting member, a frame formed of a conductive material and disposed to surround at least a portion of the display module, wherein the frame includes a first frame at least a portion of which faces the connecting member of the display module and a second frame segmented from the first frame by a split portion, a side member including a first partition wall portion disposed between the frame and the display module to be spaced apart from the frame and a second partition wall portion disposed to be spaced apart from the display module and covering at least a portion of an outer periphery of the display module, at least one opening provided in the first partition wall portion, and a first conductive connecting member extending from the second partition wall portion to the first partition wall portion, at least a portion of the first conductive connecting member being located in the opening and at least a portion of the conductive connecting member being disposed on the side member to face the connecting member.

According to various embodiments disclosed herein, it is possible to allow ESD caused by electric charges accumulated in an electronic device to flow to a ground through a mechanism constituting the exterior of the electronic device. Accordingly, a phenomenon in which damage to the electronic component occurs can be alleviated.

Before undertaking the detailed description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

In connection with the description of the drawings, the same or similar components may be denoted by the same or similar reference numerals.

DETAILED DESCRIPTION

Figure 1:
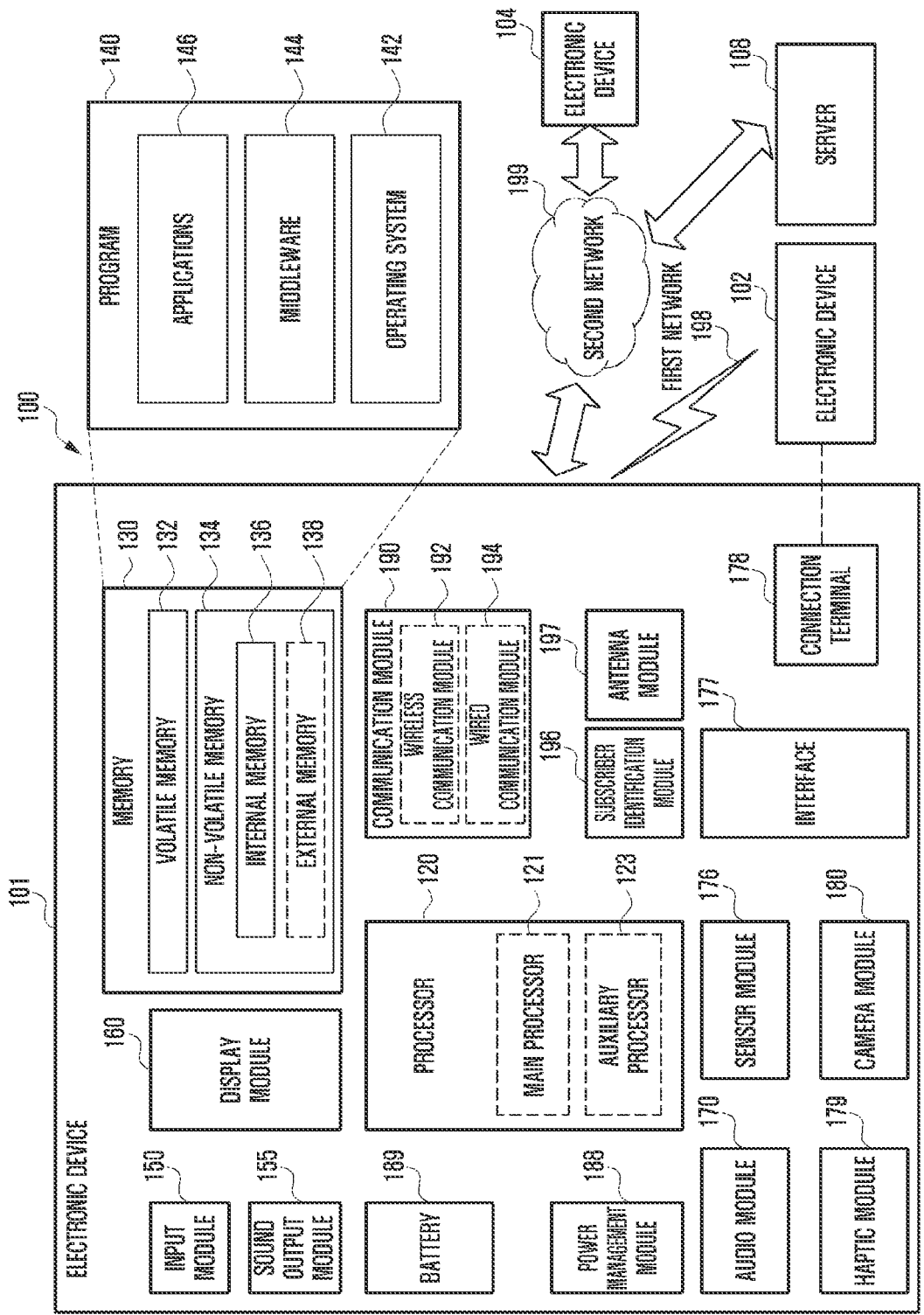
FIG. 1 illustrates a block diagram of an electronic device according to various embodiments in a network environment.

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101 from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SL)) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency hand, such as, e.g., beamforming, massive multiple-input and multiple-output (massive MIMO), full dimensional MEMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
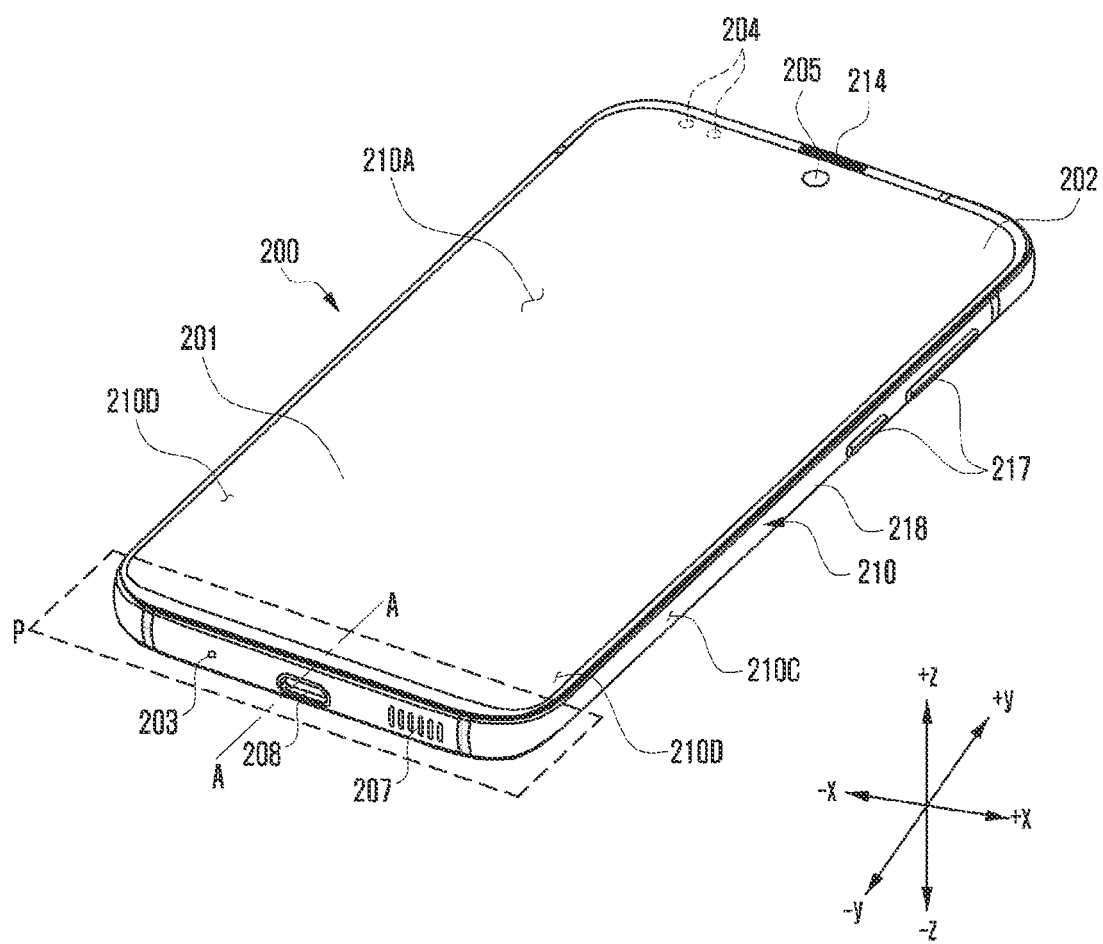
FIG. 2A illustrates a front perspective view of an electronic device, according to various embodiments.
Figure 2B:
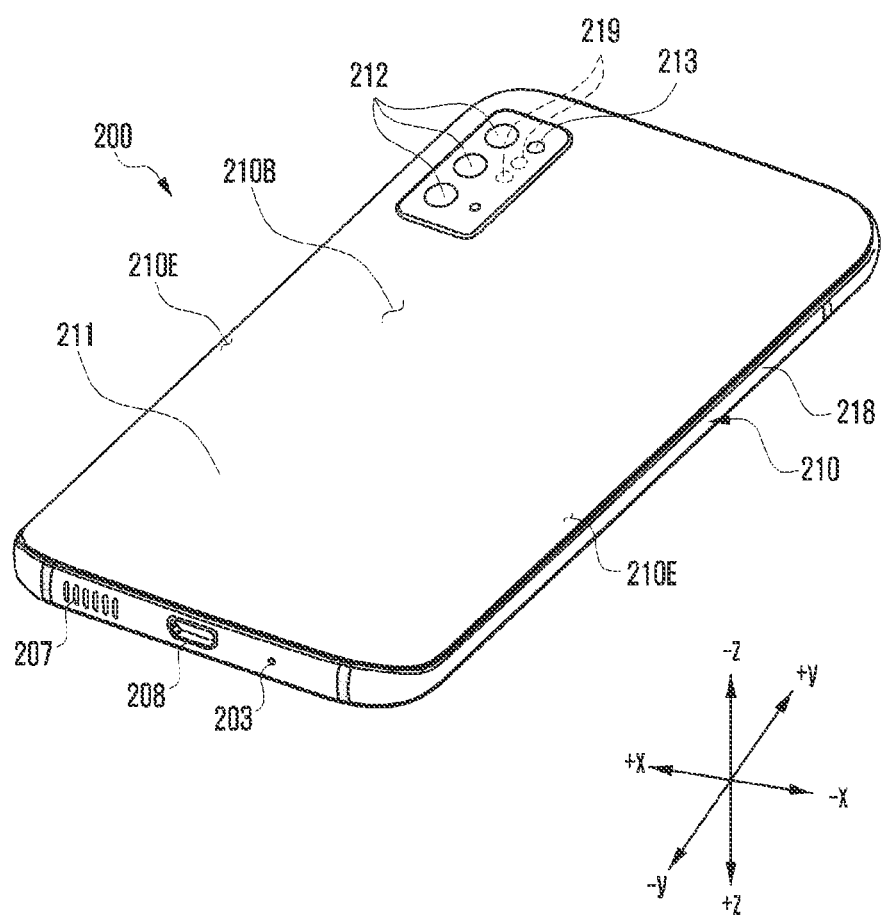
FIG. 2B illustrates a rear perspective view illustrating the electronic device of FIG. 2A, according to various embodiments.

FIG. 2A illustrates a front perspective view of an electronic device according to various embodiments of the disclosure. FIG. 2B illustrates a rear perspective view of the electronic device of FIG. 2A according to various embodiments of the disclosure.

The electronic device 200 to be described below may include at least one of the components of the electronic device 101 described above with reference to FIG. 1.

With reference to FIG. 2A and FIG. 2B, the electronic device 200 according to some embodiments may include a housing 210 that includes a first surface (or front surface) 210A, a second surface (or rear surface) 210B, and a side surface 210C surrounding a space between the first surface 210A and the second surface 210B. In other embodiments (not shown), the housing 210 may refer to a structure forming a part of the first surface 210A, the second surface 210B, and the side surface 210C in FIG. 2A. According to some embodiments, the first surface 210A may be formed by a front plate 202 (e.g., glass plate or polymer plate including various coating layers) at least a portion of which is substantially transparent. The second surface 210B may be formed by a rear plate 211 that is substantially opaque. The rear plate 211 may be formed of, for example, coated or tinted glass, ceramic, polymer, metal (e.g., aluminum, stainless steel (STS), or magnesium), or a combination of at least two thereof. The side surface 210C may be formed by a side bezel structure (or "side member") 218 coupled to the front plate 202 and the rear plate 211 and including a metal or a polymer. In a certain embodiment, the rear plate 211 and side bezel structure 218 may be integrally formed and include the same material (e.g., metal material such as aluminum).

In the illustrated embodiment, the front plate 202 may include a first region 210D that is curved and seamlessly extended from the first surface 210A toward the rear plate at opposite ends of the longer edge of the front plate 202. In the illustrated embodiment (see FIG. 2B), the rear plate 211 may include a second region 210E that is curved and seamlessly extended from the second surface 210B toward the front plate 202 respectively at opposite ends of the longer edge. In certain embodiments, the front plate 202 or the rear plate 211 may include only one of the first region 210D and the second region 210E. In a certain embodiment, the front plate 202 may not include the first region and the second region, but may include only a flat surface disposed parallel to the second surface 210B. In the above embodiments, when the electronic device is viewed from the side thereof, the side bezel structure 218 may have a first thickness (or width) on a side where the first region 210D or the second region 210E is not included, and may have a second thickness thinner than the first thickness on a side where the first region 210D or the second region 210E is included.

According to some embodiments, the electronic device 200 may include at least one of display 201, input device 203, sound output devices 207 and 214, sensor modules 204 and 219, camera modules 205 and 212, key input device 217, indicator (not shown), or connector 208. In a certain embodiment, at least one of the elements (e.g., key input device 217 or indicator) may be omitted from the electronic device 200, or another element may be added to the electronic device 200.

The display 201 may be exposed, for example, through a significant portion of the front plate 202. In a certain embodiment, at least a portion of the display 201 may be exposed through the front plate 202 forming the first surface 210A and the first region 210D of the side surface 210C. The display 201 may be coupled to or disposed adjacent to a touch sensing circuit, a pressure sensor capable of measuring the intensity (pressure) of a touch, or a digitizer that detects a magnetic field type stylus pen. In a certain embodiment, at least some of the sensor modules 204 and 219, or at least some of the key input devices 217 may be disposed on the first region 210D or the second region 210E.

The input device 203 may include a microphone 203. In a certain embodiment, the input device 203 may include a plurality of microphones 203 arranged to detect the direction of a sound. The sound output devices 207 and 214 may include speakers 207 and 214. The speakers 207 and 214 may include an external speaker 207 and a call receiver 214. In a certain embodiment, the microphone 203, the speakers 207 and 214, and the connector 208 may be at least partially disposed in the internal space of the electronic device 200, and may be exposed to the external environment through at least one hole formed in the housing 210. In a certain embodiment, the hole formed in the housing 210 may be commonly used for the microphone 203 and the speakers 207 and 214. In a certain embodiment, the sound output devices 207 and 214 may include a speaker (e.g., piezo speaker) that operates in isolation from the hole formed in the housing 210.

The sensor modules 204 and 219 may generate an electrical signal or a data value corresponding to an internal operating state of the electronic device 200 or an external environmental state. The sensor modules 204 and 219 may include, for example, a first sensor module 204 (e.g., proximity sensor) or a second sensor module (not shown) (e.g., a fingerprint sensor) disposed on the first surface 210A of the housing 210, or a third sensor module 219 (e.g., a HRM sensor) disposed on the second surface 210B of the housing 210. The fingerprint sensor may be disposed on the first surface 210A (e.g., a home key button) of the housing 210, on a portion of the second surface 210B, or under the display 201. The electronic device 200 may further include a sensor module (not shown), for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, a proximity sensor, or an illuminance sensor.

The camera modules 205 and 212 may include a first camera module 205 disposed on the first surface 210A of the electronic device 200, a second camera module 212 disposed on the second surface 210B, or a flash 213. The camera modules 205 and 212 may include one or plural lenses, an image sensor, or an image signal processor. The flash 213 may include, for example, a light emitting diode or a xenon lamp. In a certain embodiment, two or more lenses (wide-angle lens, ultra-wide-angle lens, or telephoto lens) and image sensors may be arranged in one surface of the electronic device 200.

The key input devices 217 may be arranged in the side surface 210C of the housing 210. In other embodiments, the electronic device 200 may not include some or all of the above-mentioned key input devices 217, and a key input device 217 not included may be implemented on the display 201 in a different form such as a soft key. In other embodiments, the key input devices 217 may be implemented using a pressure sensor included in the display 201.

The indicator may be disposed on, for example, the first surface 210A of the housing 210. The indicator may provide, for example, state information of the electronic device 200 in a light form (e.g., a light emitting element). In other embodiments, the light emitting element may provide a light source interacting with, for example, the operation of the camera module 205. The indicator may include, for example, an LED, an IR LED, or a xenon lamp.

The connector holes 208 may include a first connector hole 208 capable of accepting a connector (e.g., a universal serial bus (USB) connector) for transmitting and receiving power or data to and from an external electronic device, or a second connector hole (e.g., an earphone jack) (not shown) capable of accepting a connector for transmitting and receiving an audio signal to and from an external electronic device.

Some of the camera modules 205 and 212, some of the sensor modules 204 and 219, or the indicator may be disposed to be exposed through the display 201. For example, the camera module 205, the sensor module 204, or the indicator may be arranged in the internal space of the electronic device 200 so as to be in contact with the external environment through an opening of the display 201 perforated up to the front plate 202 or a transmissive region. According to some embodiments, the region in which the display 201 and the camera module 205 face each other may be formed as a transmissive region having a preset transmittance as a part of the content display area. According to some embodiments, the transmissive region may be formed to have a transmittance in a range of about 5 percent to about 20 percent. This transmissive region may include a region overlapping an effective area (e.g., an angle-of-view area) of the camera module 205 through which light passes for image generation with an image formed by an image sensor. For example, the transmissive region of the display 201 may include a region having a lower pixel density than surrounding regions. For example, the transmissive region may replace the opening. For example, the camera module 205 may include an under display camera (UDC). In other embodiments, a certain sensor module 204 may be disposed in the internal space of the electronic device so as to perform its function without being visually exposed through the front plate 202. For example, in this case, the region of the display 201 facing the sensor module may not need a perforated opening.

According to various embodiments, although the electronic device 200 has a bar-type or plate-type appearance, the disclosure is not limited thereto. For example, the illustrated electronic device 200 may be a part of a foldable electronic device, a slidable electronic device, a stretchable electronic device, or a rollable electronic device. "Foldable electronic device", "slidable electronic device", "stretchable electronic device", or "rollable electronic device" may mean an electronic device having a display (e.g., display 330 in FIG. 3) that can be deformed by bending so that at least a portion of the display may be folded, wound or rolled, at least partially expanded in area, or accommodated inside the housing (e.g., the housing 210 in FIGS. 2A and 2B). A foldable electronic device, a slidable electronic device, a stretchable electronic device, or a rollable electronic device can be used with an extended screen display area by unfolding the display or exposing a larger area of the display to the outside according to the needs or preferences of the user.

Figure 3:
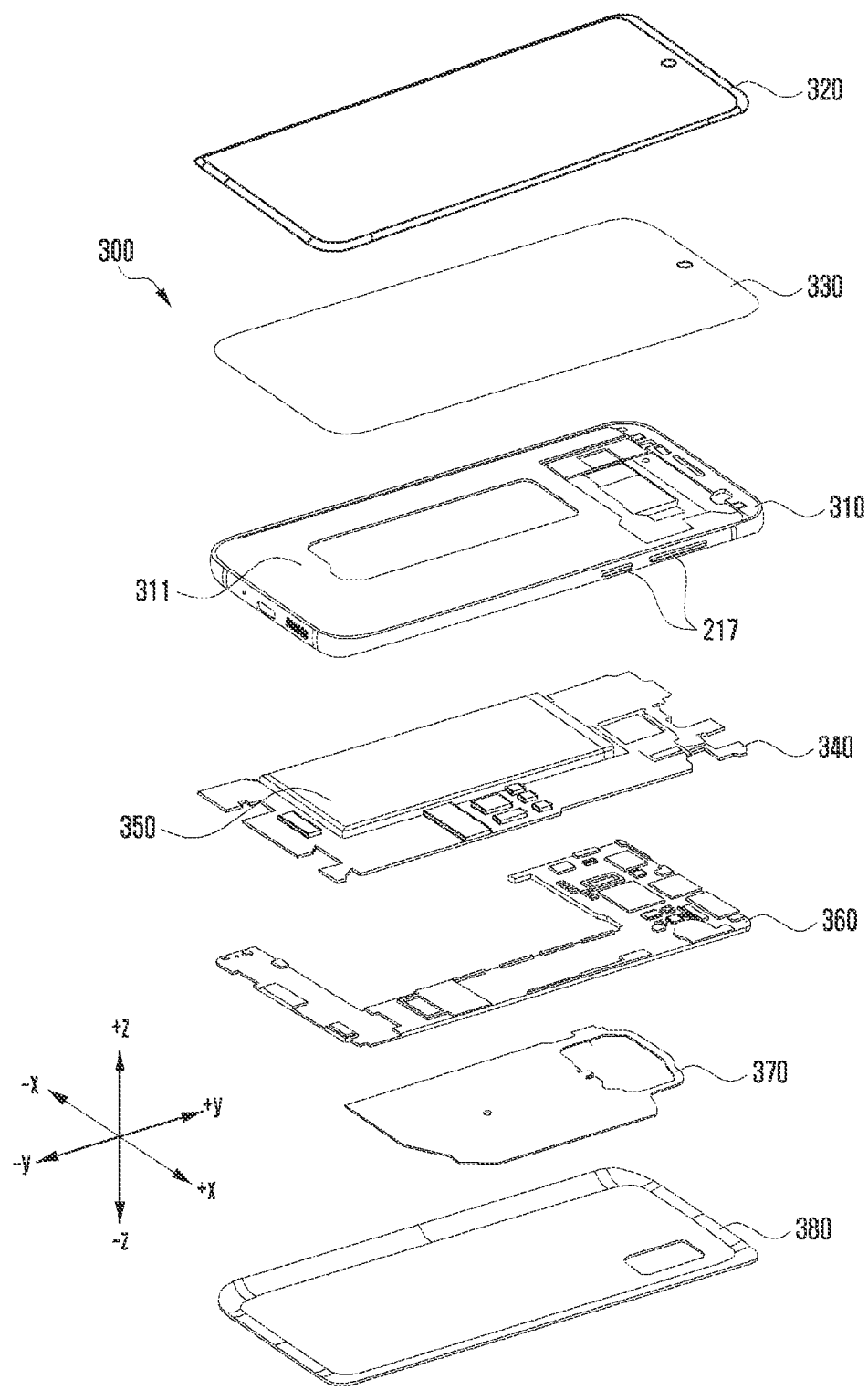
FIG. 3 illustrates an exploded perspective view of the electronic device of FIG. 2A, according to various embodiments.

FIG. 3 illustrates an exploded perspective view of the electronic device 200 of FIG. 2A according to various embodiments of the disclosure.

The electronic device 300 of FIG. 3 may be at least partially similar to the electronic device 200 of FIGS. 2A and 2B, or may include other embodiments of an electronic device.

With reference to FIG. 3, the electronic device 300 (e.g., the electronic device 200 in FIG. 2A or 2B) may include a side member 310 (e.g., a side bezel structure), a first support member 311 (e.g., a bracket or support structure), a front plate 320 (e.g., a front cover), a display 330 (e.g., the display 201 in FIG. 2A), a board 340 (e.g., a printed circuit board (PCB), flexible PCB (FPCB), or rigid-flexible PCB (RFPCB)), a battery 350, a second support member 360 (e.g., rear case), an antenna 370, and a rear plate 380 (e.g., rear cover). In a certain embodiment, at least one of the components (e.g., the first support member 311 or the second support member 360) may be omitted from the electronic device 300 or other components may be additionally included therein. At least one of the components of the electronic device 300 may be the same as or similar to at least one of the components of the electronic device 200 of FIG. 2A or 2B, and repeated descriptions will be omitted below.

The first support member 311 may be disposed inside the electronic device 300 and may be connected to the side member 310 or may be integrally formed with the side member 310. The first support member 311 may be made of, for example, a metal material or a non-metal (e.g., polymer) material. The first support member 311 may have one surface coupled to the display 330 and the other surface coupled to the board 340. A processor, a memory, or an interface may be mounted on the board 340. The processor may include, for example, one or more of a central processing unit, an application processor, a graphics processing unit, an image signal processor, a sensor hub processor, and a communication processor.

The memory may include, for example, a volatile memory or a non-volatile memory.

The interface may include, for example, a high definition multimedia interface (HDMI), a universal serial bus (USB) interface, an SD card interface, or an audio interface. The interface may, for example, electrically or physically connect the electronic device 300 to an external electronic device, and may include a USB connector, an SD card/MMC connector, or an audio connector.

The battery 350 is a device for supplying power to at least one component of the electronic device 300, and may include, for example, a non-rechargeable primary cell, a rechargeable secondary cell, or a fuel cell. At least a portion of the battery 350 may be disposed substantially coplanar with the board 340, for example. The battery 350 may be integrally disposed inside the electronic device 300. In other embodiments, the battery 350 may be disposed attachably and detachably with the electronic device 300.

The antenna 370 may be disposed between the rear plate 380 and the battery 350. The antenna 370 may include, for example, a near field communication (NFC) antenna, a wireless charging antenna, or a magnetic secure transmission (MST) antenna. The antenna 370 may, for example, perform short-range communication with an external device or wirelessly transmit and receive power used for charging. In other embodiments, an antenna structure may be formed by a part of the side bezel structure 310 or the first support member 311 or a combination thereof.

Hereinbelow the same reference numerals are used for the same or similar components, except for a case in which where reference numerals are separately indicated.

Figure 4:
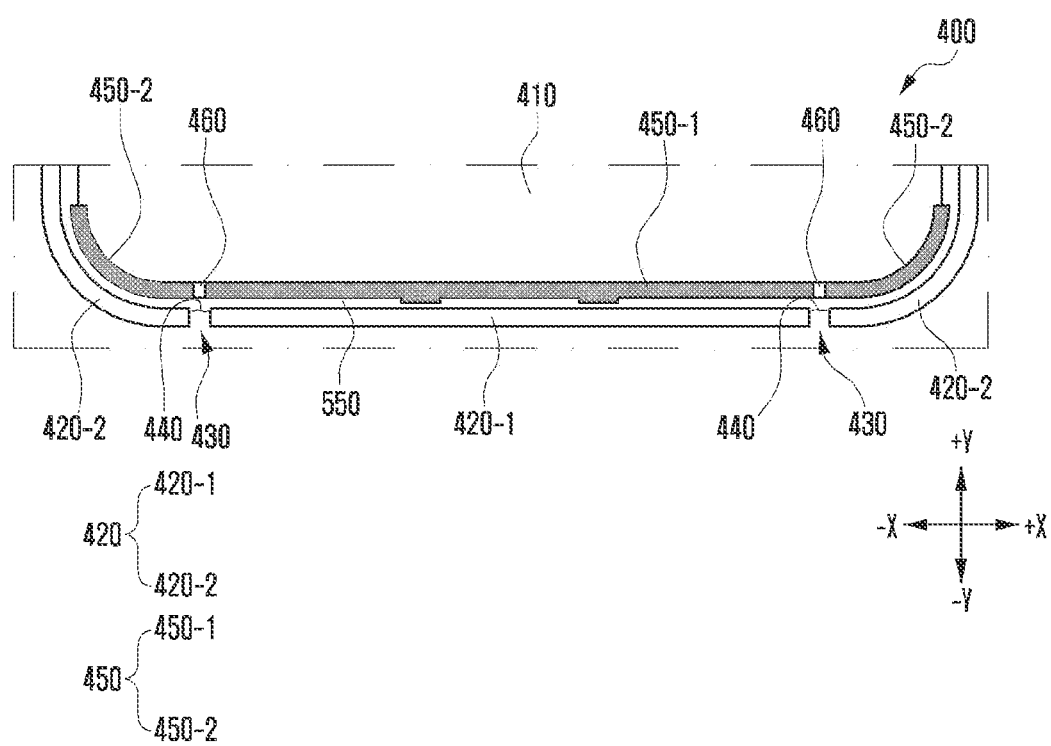
FIG. 4 illustrates an enlarged plan view of an area P illustrated in FIG. 2A.
Figure 5A:
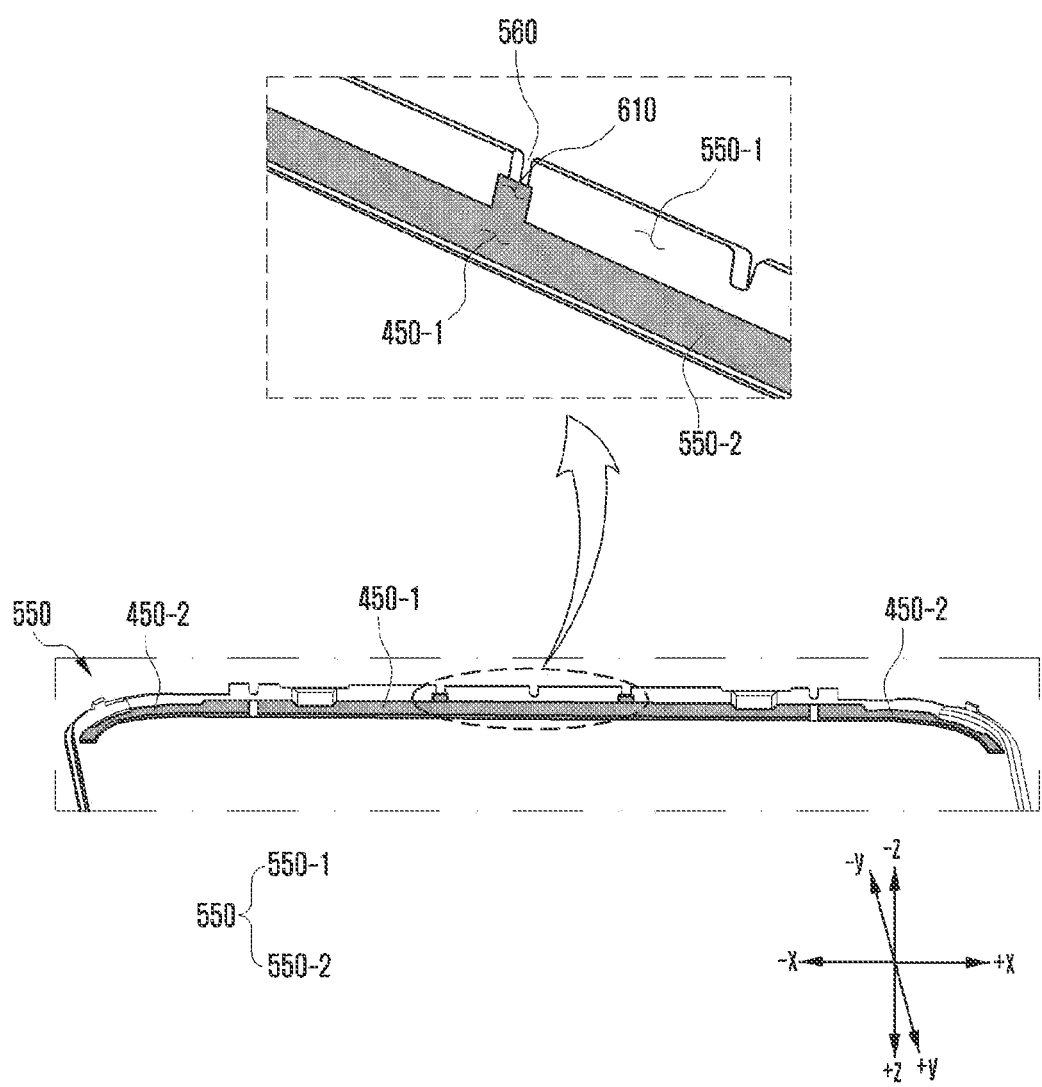
FIG. 5A illustrates a view illustrating a conductive connecting member disposed on a side member, according to various embodiments.
Figure 5B:
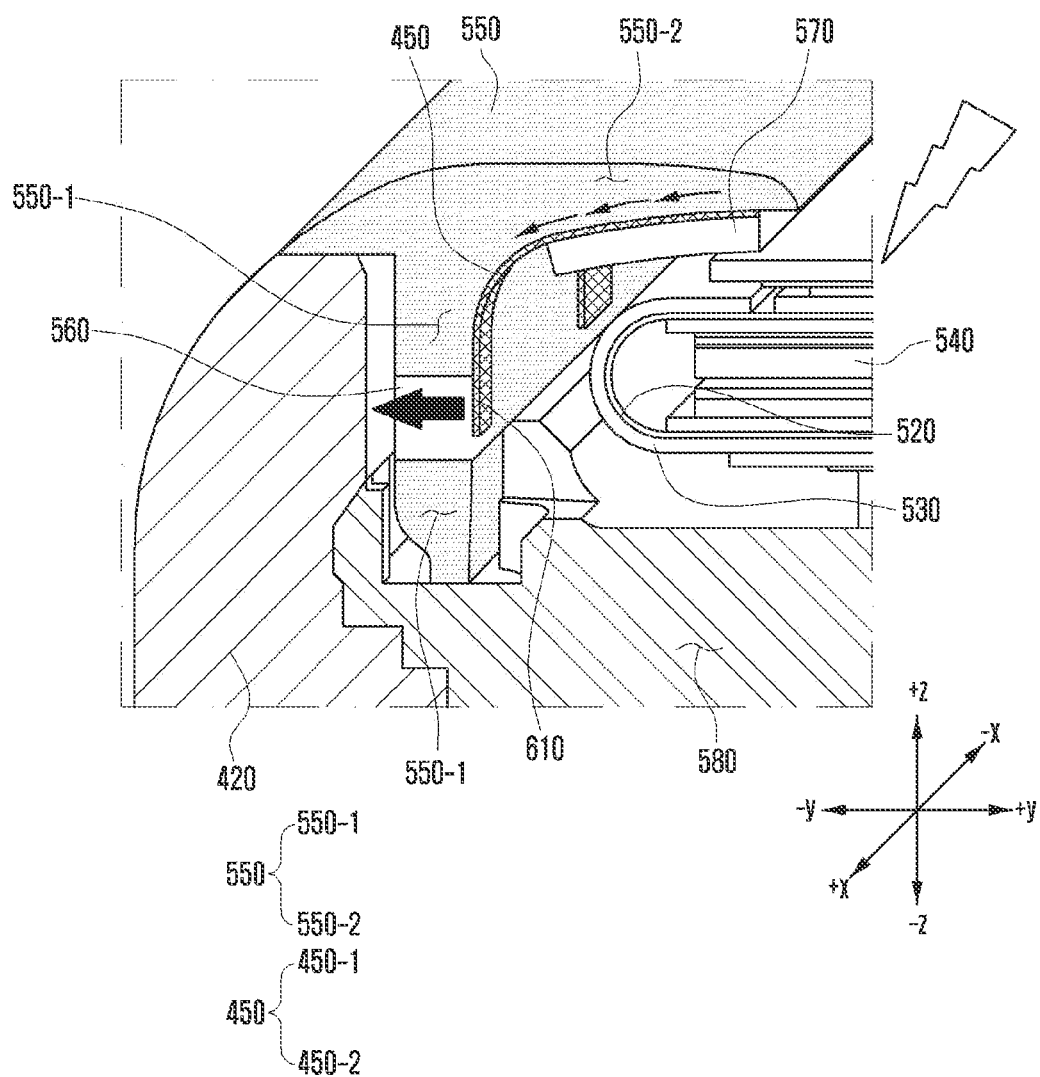
FIG. 5B illustrates a perspective view taken along line A-A in FIG. 2A.
Figure 6A:
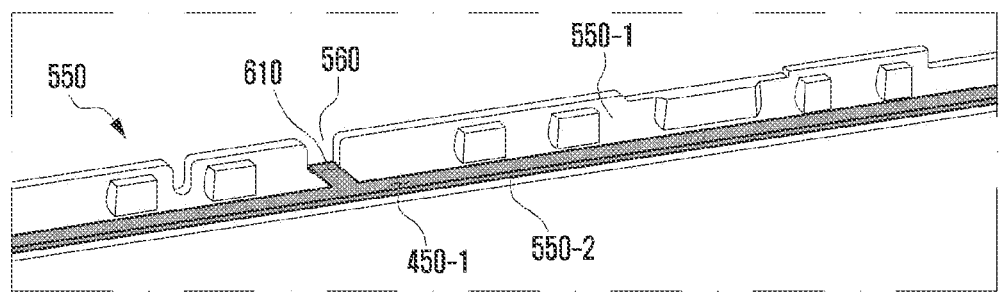
FIGS. 6A and 6B illustrate views illustrating a conductive connecting member disposed on a side member in another embodiment.
Figure 6B:
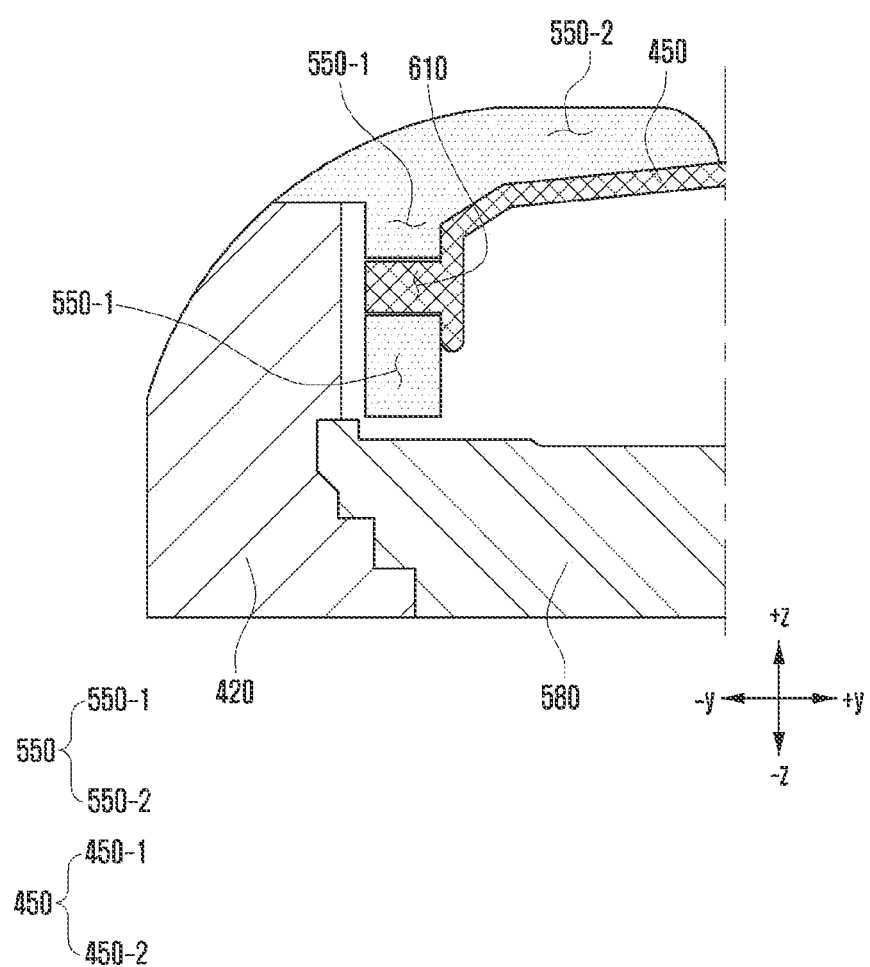
Figure 6C:
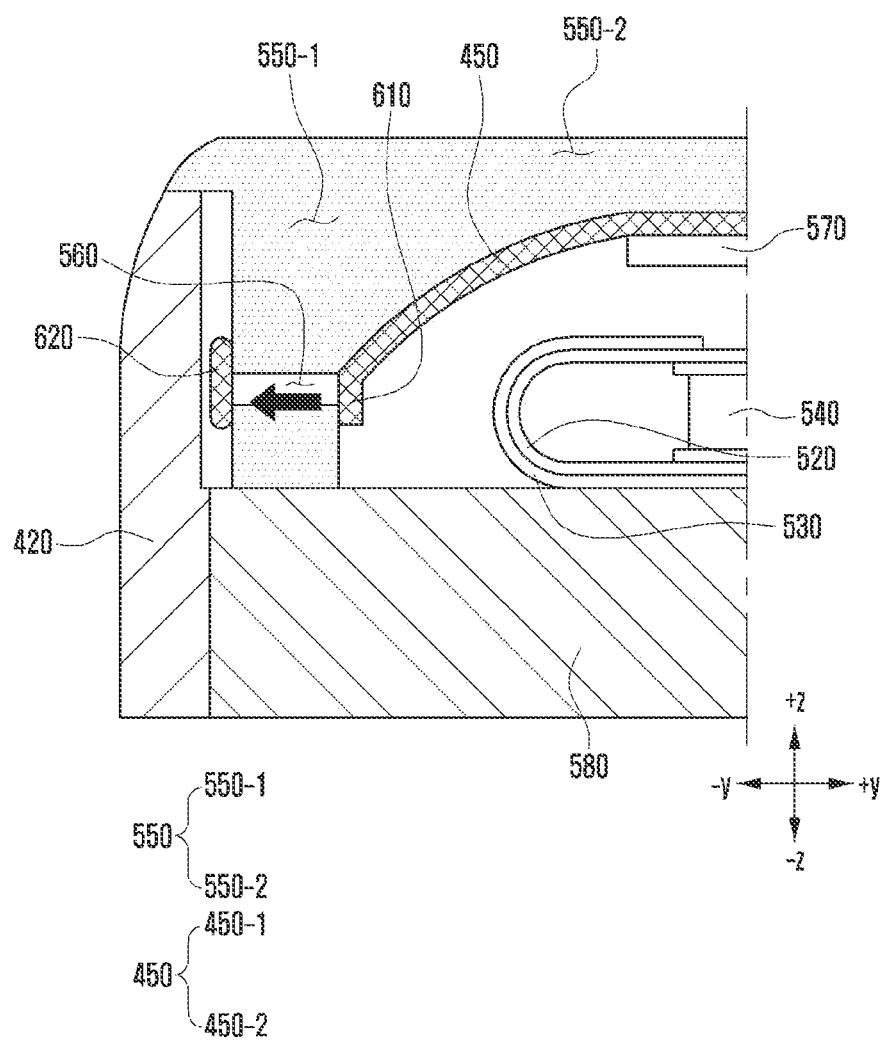
FIG. 6C illustrates a view illustrating an auxiliary conductive connecting member disposed on the side member between a frame and the side member, according to various embodiments.

FIG. 4 illustrates an enlarged plan view of an area P illustrated in FIG. 2A. FIG. 5A illustrates a view illustrating a conductive connecting member 450 (e.g., conductive member 450) disposed on a side member 550, according to various embodiments. FIG. 5B illustrates a perspective view taken along line A-A in FIG. 2A. FIGS. 6A and 6B illustrate views illustrating a conductive connecting member 450 disposed on a side member 550 in another embodiment. FIG. 6C illustrates a view illustrating an auxiliary conductive connecting member 450 disposed on the side member 550 between the frame 420 and the side member 550, according to various embodiments.

The electronic device 400 illustrated in FIG. 4 may be an example of the electronic device 101 of FIG. 1, the electronic device 200 of FIG. 2A, or the electronic device 300 of FIG. 3 described above.

As illustrated in FIG. 4, the electronic device 400 according to various embodiments disclosed herein may include a frame 420 (e.g., the side bezel structure 218 in FIG. 2A or the side member 310 in FIG. 3) constituting the exterior of the side surface (e.g., the side surface 210C in FIG. 2A) of the electronic device 400. In some embodiments, the frame 420 may be disposed to surround a display module 410 (e.g., the display module 160 in FIG. 1, the display 201 in FIG. 2A, or the display 330 in FIG. 3) of the electronic device 400. In some embodiments, the frame 420 may be formed of a conductive material such as a metal material. For example, the frame 420 may be formed of a metal material including aluminum (Al).

According to various embodiments, the frame 420 may be electrically connected to a printed circuit board (e.g., the board 340 in FIG. 3) electrically connected to at least one ground. As will be described later in an embodiment, electric charges accumulated in the electronic device 400 may be conducted to the frame 420 formed of a conductive material and may move to ground. Here, the accumulated electric charges may mean electric charges generated according to the operation of an electronic component disposed inside the electronic device 400, and may mean electric charges accumulated on the outer portion (or the surface) of the electronic device and conducted to the inside of the electronic device through a gap formed in the electronic device 400. Hereinafter, the accumulated electric charges may have a meaning to cover all of the above-described electric charges.

According to various embodiments, the frame 420 may be formed of a conductive material and used as an antenna of the electronic device 400. The frame 420 may be electrically connected to a communication module of the electronic device 400 to transmit or receive a communication signal (e.g., an RF signal) to an external device. In some embodiments, the frame 420 may be electrically connected to the communication module via an RF wire. Here, the RF wire may be a component that transmits a radio frequency (RF) signal. The RF wire may transmit an RF signal processed by the communication module of the electronic device 400 to the frame 420 serving as an antenna, or may transmit an RF signal received by the frame 420 to the communication module.

According to various embodiments, as illustrated in FIG. 4, the frame 420 may include a plurality of first split portions 430. The frame 420 may be physically segmented into a plurality of portions by the first split portions 430. Here, the first split portions 430 may be spaces provided in the frame 420 so that one frame 420 can be segmented into a plurality of portions. In other embodiments, the first split portions 430 may be spaces provided as a plurality of frames 420 are arranged to be spaced apart from each other.

In some embodiments, referring to FIG. 4, the frame 420 may be physically segmented into a first frame 420-1 and second frames 420-2 by the first split portions 430. In some embodiments, the first frame 420-1 may be a portion of a frame 420 that is disposed between corners of the electronic device 400 to constitute the exterior of the electronic device 400. The second frames 420-2 may be portions of the frame 420 that are disposed at the corners of the electronic device 400 and may be a part of the frame 420 to constitute the exterior of the electronic device 400.

In some embodiments, since first insulating members 440 are disposed in the first split portions 430, the frame 420 may be electrically segmented. Here, the first insulating members 440 may refer to a material having low conductivity or a material having a low dielectric constant. In some embodiments, when the frame 420 is used as an antenna of the electronic device 400, an antenna resonance frequency may be determined depending on the physical length of the frame 420. The frame 420 may be segmented into a plurality of portions having different lengths by the first insulating members 440 disposed in the first split portions 430. As such, the segmented frames 420 may have different resonance frequencies. When the frames 420 having different resonance frequencies are used, communications in various frequency bands (e.g., a short-range communication and a long-range communication) may be possible.

According to various embodiments, various electronic components driven by transmitting or receiving an electrical signal may be disposed inside the electronic device 400. These components will be referred to as "electrical objects" below. The electrical objects may be formed of a conductive material or may include at least one conductive material. In some embodiments, the electrical objects may be disposed in portions adjacent to the first insulating members 440 that electrically segment the frame 420 into a plurality of portions. Since the electrical objects are disposed adjacent to the first insulating members 440, a coupling phenomenon may occur between the plurality of segmented frames 420. As described above, each of the frames 420 may have a preset resonance frequency. When a coupling phenomenon occurs between the plurality of frames 420, the resonance frequencies of the frames 420 may be changed. Due to this, transmission or reception efficiency of communication signals through the frames 420 may decrease.

In some embodiments, the electronic device 400 may include a conductive connecting member 450. When the conductive connecting member 450 is disposed adjacent to the first insulating members 440, a coupling phenomenon may occur between the plurality of frames 420 as described above. In order to prevent this phenomenon, the conductive connecting member 450 may be segmented into a plurality of portions by second split portions 460. For example, referring to FIG. 4, the conductive connecting member 450 may be segmented into a first conductive connecting member 450-1 and a second conductive connecting member 450-2 with reference to the second split portions 460. The second split portions 460 may be positioned to correspond to the first split portions 430. For example, when the electronic device 400 is viewed in the +Y direction with reference to FIG. 4, the first split portions 430 and the second split portions 460 may coincide with each other or one of the first split portions 430 and the second split portions 460 may include the other. As will be described later, the first conductive connecting member 450-1 may be at least partially attached to a side member 550 disposed between the frame 420 and the display module 410 to correspond to the first frame 420-1. The second conductive connecting members 450-2 may be attached to the side member 550 to correspond to the second frames 420-2. Since the conductive connecting member 450 is segmented with reference to the second split portions 460 corresponding to the first split portions 430, the first insulating members 440 filling the first split portions 430 may not be disposed adjacent to each other. Accordingly, the coupling phenomenon between the plurality of frames 420 can be alleviated or resolved.

In some embodiments, the frame 420 may be disposed to surround a housing (e.g., the housing 210 in FIGS. 2A and 2B) in which electronic components are disposed to constitute the side exterior of the electronic device 400. At least a portion of the housing may be formed of a material other than a metal. For example, a portion adjacent to the first insulating members 440 of the housing may be formed of a material other than a metal. Referring to FIG. 5B, an internal injection-molded product 580 constituting the housing may be located adjacent to the first insulating members 440. The internal injection-molded product 580 may be formed of a non-metal material such as synthetic resin, ceramic, or engineering plastic. Accordingly, the coupling phenomenon between the plurality of frames 420 segmented by the first insulating members 440 can be alleviated or resolved.

According to various embodiments, as illustrated in FIG. 4, the electronic device 400 may include a side member 550 at least partially disposed between the frame 420 and the display module 410. The side member 550 may include a first partition wall portion 550-1 (e.g., a first portion 550-1) disposed between the frame 420 and the outer peripheral portion (e.g., edge portion) of the display module 410 and a second partition wall portion 550-2 (e.g., a second portion 550-2) extending from the first partition wall portion 550-1 to cover at least a portion of the outer peripheral portion of the display module 410. In some embodiments, the first partition wall portion 550-1 may be disposed to be spaced apart from the first frame 420-1 between the frame 420 and the display module 410. As the first partition wall portion 550-1 is disposed to be spaced apart from the frame 420, a space may be formed between the first partition wall portion 550-1 and the frame 420. In some embodiments, the second partition wall portion 550-2 may be in the state of covering at least a portion of the outer peripheral portion of the display module 410 when the electronic device 400 is viewed in the −Z direction in FIG. 2A.

In some embodiments, the side member 550 may be formed of a non-metallic material such as synthetic resin, ceramic, or engineering plastic so that coupling does not occur between the plurality of frames 420 segmented by the first split portions 430. When the side member 550 is formed of a non-conductive material, electric charges may be accumulated on the side member 550. When a path through which the electric charges accumulated in the side member 550 may flow is not provided, an electrostatic discharge (ESD) phenomenon may occur. In particular, the side member 550 is a portion frequently touched when a user grips the electronic device 400, and may be a portion on which electric charges are well-accumulated. According to various embodiments disclosed herein, a discharge phenomenon due to electrostatic charges on the side member 550 may be reduced by inducing the flow of electric charges through the conductive connecting member 450.

According to various embodiments, as illustrated in FIG. 5A, the conductive connecting member 450 may be disposed on the side member 550. The conductive connecting member 450 may be disposed on the side member 550 in various ways. For example, the conductive connecting member 450 may be attached to the side member 550 via an adhesive member such as a bond or double-sided tape. In some embodiments, the conductive connecting member 450 may be deposited on the side member 550 in the form of a thin film. For example, the conductive connecting member 450 may be deposited by various methods such as a chemical vapor deposition (CVD) method or a physical vapor deposition (PVD) method. In addition, the conductive connecting member 450 may be disposed on the side member 550 in various ways within a range that is capable of being modified by a person ordinarily skilled in the art.

According to various embodiments, as illustrated in FIG. 5B, the conductive connecting member 450 may be disposed on the first partition wall portion 550-1 and the second partition wall portion 550-2 to face the display module 410. In some embodiments, referring to FIGS. 5A and 5B, the conductive connecting member 450 may have a form extending from the second partition wall portions 550-2 to the first partition wall portion 550-1. As described above, the conductive connecting member 450 may be segmented into the first conductive connecting member 450-1 and the second conductive connecting members 450-2 through the second split portions 460. The first conductive connecting member 450-1 may be attached to the side member 550 to correspond to the first frame 420-1. In some embodiments, referring to FIG. 4, the first conductive connecting member 450-1 may be positioned between corners of the electronic device 400 to correspond to the first frame 420-1, and to face a connecting member 520, 530 including a bending portion 520 of the display module 410 to be described later and a protective layer 530. The second conductive connecting members 450-2 may be disposed on the side member 550 to correspond to the second frames 420-2. Since the second conductive connecting members 450-2 are positioned at corners of the electronic device 400 to correspond to the second frames 420-2, the second conductive members 450-2 may be located adjacent to a support member 540 of the display module 410 disposed in an inner area of the bending portion 520 of the display module 410. In contrast, the first conductive connecting member 450-1 may not be located adjacent to the support member 540 because the bending portion 520 covers the support member 540 disposed in the inner area of the bending portion 520.

According to various embodiments, as illustrated in FIG. 5B, the display module 410 may include a connecting member 520, 530 including a bending portion 520 connected to the display panel and extending to the rear surface of the display module 410 and a protective layer 530 enclosing the outer surface of the bending portion 520. The connecting member 520, 530 may be electrically connected to a printed circuit board disposed on a rear surface (e.g., a surface oriented in the −Z direction with respect to FIG. 5B) of the display module 410. The protective layer constituting the connecting member 520, 530 may be formed of a flexible material to be bent together with the bending portion 520 in response to the movement of the bending portion 520. The protective layer may be formed of an insulating material to protect the bending portion 520 from electric charges accumulated in the electronic device 400. The bending portion 520 may include a display driver IC (DDI). The bending portion 520 may be configured integrally with a board (not illustrated) disposed on the display module 410. For example, the display module 410 may include a chip on panel (COP) structure in which the DDI is disposed on the bending portion 520 configured integrally with the board of the display module 410. In some embodiments, the display module 410 may include a chip on film (COF) structure in which the bending portion 520 on which the DDI is disposed is separately manufactured and connected to the board of the display module 410. In this case, the bending portion 520 may be a flexible printed circuit board (FPCB).

In some embodiments, referring to FIG. 5B, the display module 410 may include a support member 540 formed of a conductive material. The support member 540 may be a ground having a relatively lower potential than its surroundings. For example, the support member 540 may be electrically connected to a printed circuit board connected to at least one ground. The electric charges accumulated in the electronic device 400 may be induced to the support member 540 serving as a ground having a relatively low potential. As the electric charges move to the support member 540, the electric charges may not be accumulated around the support member 540.

According to various embodiments, an electrostatic discharge (ESD) phenomenon may occur due to the accumulated electric charges. Here, the ESD phenomenon may refer to an electrical phenomenon generated by instantaneous movement of electric charges accumulated in one portion by various factors to another portion. Since ESD is accompanied by a strong voltage, when the ESD phenomenon occurs in an electronic component, the electronic component may be damaged. Such damage may cause problems such that the electronic device 400 may not function properly or the performance of the electronic device may be deteriorated.

In some embodiments, electric charges accumulated in the electronic device 400 may move into the electronic device 400 through a gap formed according to the design of the electronic device 400. For example, the second partition wall portion 550-2 of the side member 550 may be spaced apart from the display module 410 in the +Z direction with reference to FIG. 5B. In this case, a gap may occur between the second partition wall portion 550-2 and the display module 410. Electric charges accumulated outside the electronic device 400 may move into the electronic device 400 through a gap between the second partition wall portion 550-2 of the side member 550 and the display module 410. In some embodiments, when a structure in which the electric charges accumulated in the electronic device 400 are grounded is not designed, the accumulated electric charges may be discharged to an electronic component and damage the electronic component. For example, electronic components constituting the display module 410 may be damaged due to the ESD phenomenon in which accumulated electric charges are discharged to the electronic components constituting the display module 410. In various embodiments disclosed herein, a path through which the accumulated electric charges moves may be suggested. As the moving path of electric charges is formed inside the electronic device 400, the phenomenon in which the electronic components are damaged may be alleviated or resolved.

According to various embodiments, the electric charges accumulated in the electronic device 400 may move to ground via the conductive connecting member 450 disposed on the side member 550.

In some embodiments, the first conductive connecting member 450-1 may be disposed on the side member 550 to face the connecting member 520, 530 including the bending portion 520 of the display module 410 that is covered with the protective layer 530 formed of an insulating material as described above. As described above, the bending portion 520 may cover the conductive support member 540 disposed in the inner area of the bending portion 520 from the first conductive connecting member 450-1. In this case, the accumulated electric charges cannot be conducted to the support member 540 via the first conductive connecting member 450-1. In this structure, the accumulated electric charges cannot move to ground via the first conductive connecting member 450-1. Accordingly, the accumulated electric charges may be conducted to an electronic component disposed adjacent to the first conductive connecting member 450-1 and may cause damage to the electronic component. According to some embodiments disclosed herein, a path through which the electric charges accumulated in the electronic device 400 move to a point having a relatively low potential by using the first conductive connecting member 450-1 may be suggested. Hereinafter, a moving path of electric charges suggested in the present disclosure will be described.

According to various embodiments, as illustrated in FIGS. 5A and 5B, an opening 560 may be provided in the side member 550. The opening 560 may be provided in at least one of a first partition wall portion 550-1 and a second partition wall portion 550-2 constituting the side member 550. In some embodiments, referring to FIG. 5A, the opening 560 may be formed in the first partition wall portion 550-1 of the side member 550. Here, as illustrated in FIG. 5B, the opening 560 may be a passage that connects the space between the first frame 420-1 and the first partition wall portion 550-1 to the internal space of the electronic device 400.

In some embodiments, the first conductive connecting member 450-1 may be disposed to extend from the second partition wall portion 550-2 to the first partition wall portion 550-1 so that at least a portion of the first conductive connecting member 450-1 may be disposed in the opening 560. In some embodiments, referring to FIG. 5B, the first conductive connecting member 450-1 may include a pad portion 610 at least partially disposed in the opening 560.

According to various embodiments disclosed herein, the first conductive connecting member 450-1 may be a path through which accumulated electric charges move to ground. The first conductive connecting member 450-1 may induce the flow of electric charges from the second partition wall portion 550-2 to the frame 420. As described above, the first conductive connecting member 450-1 may extend from the second partition wall portion 550-2 to the first partition wall portion 550-1 to be disposed on the side member 550. A portion of the first conductive connecting member 450-1 may be positioned in the opening 560 provided in the first partition wall portion 550-1. In some embodiments, referring to FIG. 5B, electric charges accumulated outside the electronic device 400 may move into the electronic device 400 through the gap between the side member 550 and the display module 410. The accumulated electric charges may move to the first conductive connecting member 450-1 disposed on the first partition wall portion 550-1 along the first conductive connecting member 450-1 disposed on the second partition wall portion 550-2. Since a portion of the first conductive connecting member 450-1 is positioned adjacent to the opening 560, the accumulated electric charges may be discharged into the air through the opening 560. The electric charges discharged into the air may be conducted to the first frame 420-1 formed of a conductive material. Since the first frame 420-1 is electrically connected to at least one ground, accumulated electric charges may flow to ground. In addition, the first conductive connecting member 450-1 may be a path that conducts accumulated electric charges to the opening 560 so that the electric charges accumulated inside the electronic device 400 according to the operation of an electronic component can be conducted to the first frame 420-1 through the opening 560. Accordingly, since the accumulated electric charges move to ground, the ESD phenomenon caused by the accumulated electric charges can be alleviated or resolved.

However, this does not mean that the accumulated electric charges are limited to moving to the opening 560 only through the first conductive connecting member 450-1. In other embodiments, the accumulated electric charges may move to the opening 560 provided in the side member 550 along the second conductive connecting members 450-2 to be discharged into the air through the opening 560. The accumulated electric charges may pass through the opening 560 to be conducted to the second frames 420-2. Since the second frames 420-2 is electrically connected to at least one ground, the accumulated electric charges may flow to ground.

According to various embodiments, the accumulated electric charges may be conducted to the second conductive connecting members 450-2. As described above, since the second conductive connecting members 450-2 are positioned at corners of the electronic device 400 to correspond to the second frames 420-2, the second conductive members 450-2 may be located adjacent to a support member 540 of the display module 410 disposed in an inner area of the bending portion 520 of the display module 410. The second conductive connecting member 450-2 may induce the flow of electric charges to the support member 540. The accumulated electric charges may move along the second conductive connecting member 450-2 and may be conducted to the conductive support member 540 disposed in the display module 410. Since the accumulated electric charges move to the support member 540 electrically connected to ground, the ESD phenomenon caused by the accumulated electric charges may be alleviated or resolved.

According to various embodiments, a second insulating member 570 may be disposed between the side member 550 and the display module 410. Referring to FIG. 5B, electronic components constituting the display module 410 may be exposed in a partial area of the display module 410. When the electric charges accumulated in the electronic device 400 are conducted to the electronic components constituting the display module 410, damage to the electronic components may be caused. To alleviate this problem, the second insulating member 570 may be disposed to cover the exposed area in which the electronic components of the display module 410 are exposed.

In some embodiments, the second insulating member 570 may guide the accumulated electric charges to be conducted to the conductive connecting member 450 without being conducted to the area in which the electronic components constituting the display module 410 are exposed. For example, referring to FIG. 5B, the second insulating member 570 may be disposed to cover the first conductive connecting member 450-1 disposed between the display module 410 and the second partition wall portion 550-2. In addition, the second insulating member 570 may close a gap between the second partition wall portion 550-2 and the display module 410. When the electric charges accumulated outside the electronic device 400 move into the electronic device 400 through the gap of the electronic device 400, the accumulated electric charges may be conducted to the first conductive connecting member 450-1 without being conducted to the area in which the electronic components constituting the display module 410 are exposed.

According to various embodiments, the conductive connecting member 450 may be positioned adjacent to the opening 560 provided in the member 550 in various ways. In some embodiments, the conductive connecting member 450 may include a pad portion 610. The pad portion 610 may be positioned adjacent to the opening 560. Referring to FIGS. 5A and 5B, the pad portion 610 may be disposed adjacent to the opening 560 so that a portion of the opening 560 is covered. In other embodiments, the pad portion 610 may be disposed inside the opening 560. Referring to FIG. 6A, the pad portion 610 may be positioned inside the opening 560 to be located adjacent to the frame 420. In other embodiments, referring to FIG. 6B, the pad portion 610 may fill the opening 560. For example, the pad portion 610 may be manufactured in a shape corresponding to the opening 560 and disposed in the opening 560, or may be deposited inside the opening 560 through various methods such as a CVD method or a PVD method. In addition, the pad portion 610 may be disposed in the opening 560 in various ways within a range that is capable of being modified by a person ordinarily skilled in the art.

According to various embodiments, the pad portion 610 may fill the opening 560 or may be disposed inside the opening 560 to come into contact with the frame 420, which can be formed of a conductive material. In this case, since the frame 420 and the conductive connecting member 450 are electrically connected to each other, the resonance frequency of the frame 420 may be changed, making it difficult or impossible to communicate in a desired frequency band. Accordingly, the pad portion 610 may be spaced apart from the frame 420, so as not to come into contact with the frame 420.

According to various embodiments, an auxiliary connecting member 620 may be disposed between the frame 420 and the side member 550. Referring to FIG. 6C, the auxiliary connecting member 620 may be disposed on the first partition wall portion 550-1 to cover at least a portion of the opening 560 in the area between the frame 420 and the first partition wall portion 550-1. The auxiliary connecting member 620 may be formed of a conductive material such as a metal. The auxiliary connecting member 620 may increase the conductivity of electric charges discharged into the air through the opening 560 to be conducted to the frame 420. In some embodiments, the auxiliary connecting member 620 may be attached to the side member 550 to cover at least a portion of the opening 560 via an adhesive member such as a bond or double-sided tape. In other embodiments, the auxiliary connecting member 620 may be deposited on the side member 550 to cover at least a portion of the opening 560 through a CVD method or a PVD method. In addition, the auxiliary connecting member 620 may be disposed on the side member 550 in various ways within a range that is capable of being modified by a person ordinarily skilled in the art.

Figure 7A:
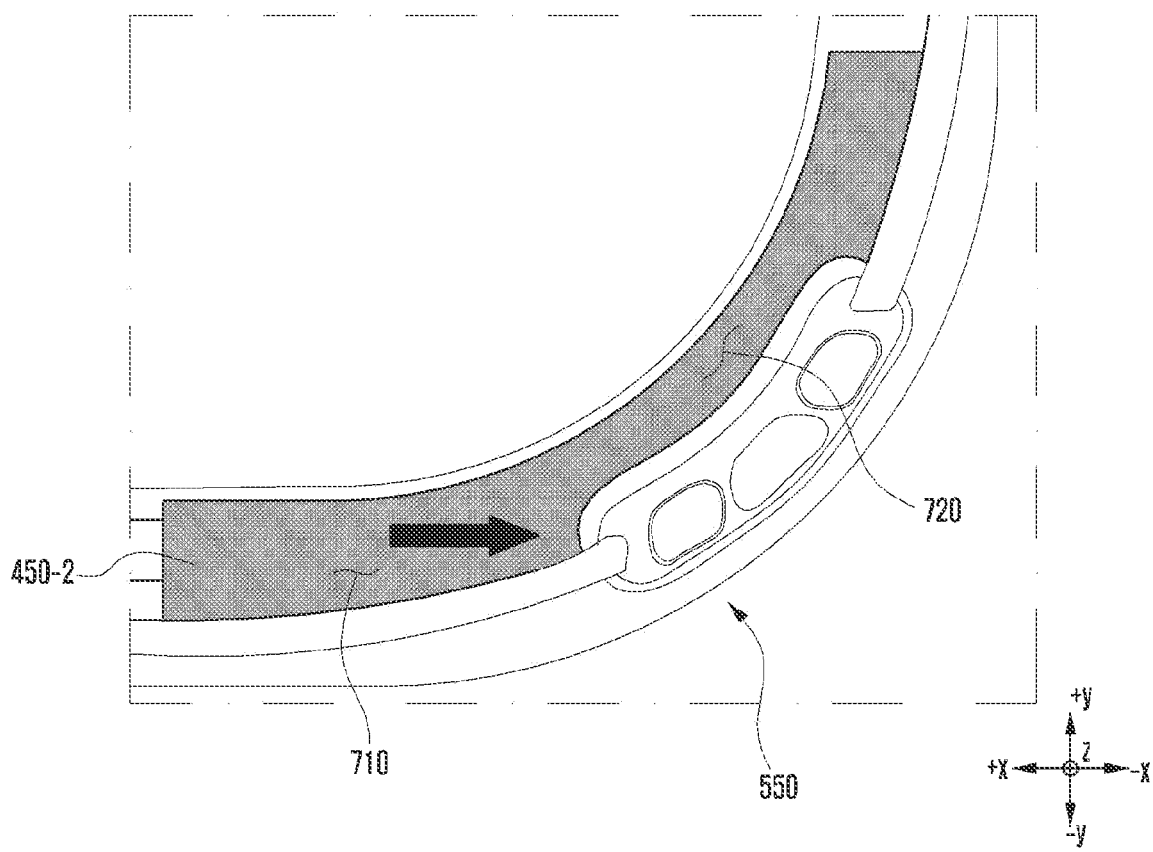
FIG. 7A illustrates an enlarged view of a second conductive connecting member according to various embodiments.
Figure 7B:
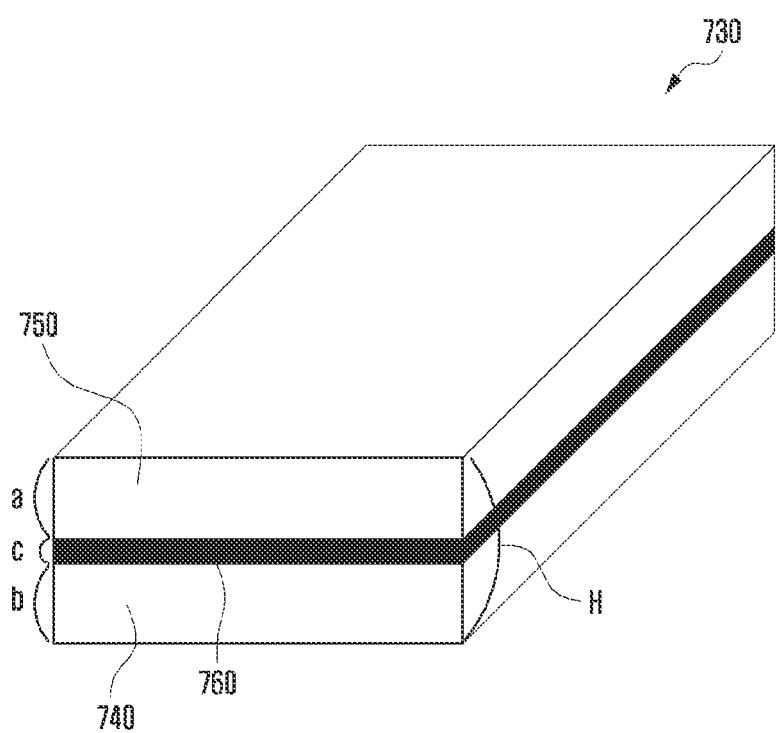
FIG. 7B illustrates a perspective view of a third conductive connecting member disposed on the second conductive connecting member, according to various embodiments.
Figure 7C:
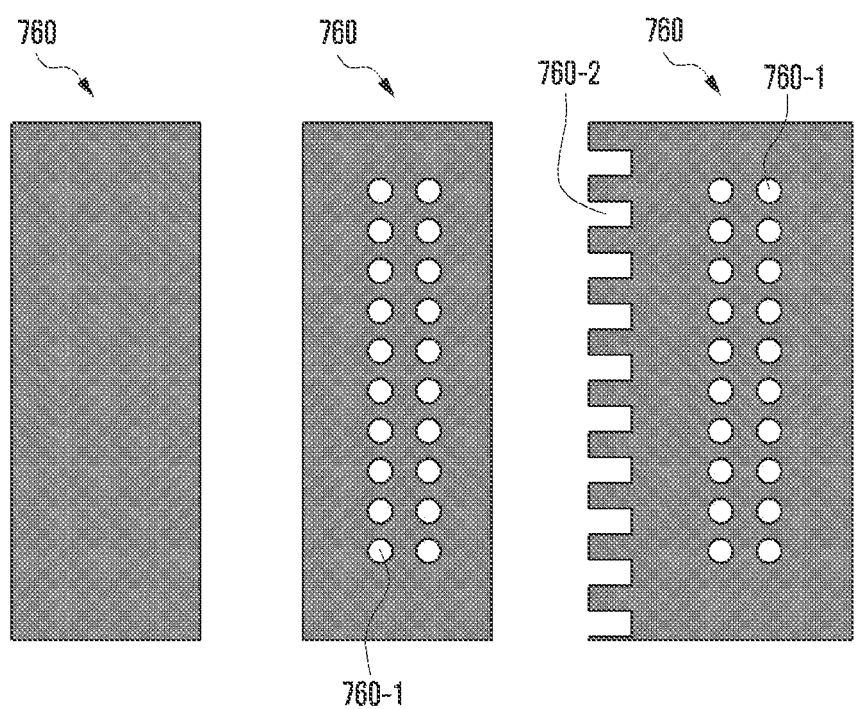
FIG. 7C illustrates a view illustrating a pattern of an insulating layer constituting the third conductive connecting member according to various embodiments.

FIG. 7A illustrates an enlarged view of the second conductive connecting member 450-2 according to various embodiments. FIG. 7B illustrates a perspective view of a third conductive connecting member 730 disposed on the second conductive connecting member 450-2 according to various embodiments. FIG. 7C illustrates a view illustrating a pattern of an insulating layer 760 constituting the third conductive connecting member 730 according to various embodiments.

According to various embodiments, the conductive connecting member 450 may be provided in various shapes according to the shape of the side member 550 to which the conductive connecting member 450 is attached or deposited. For example, some areas of the side member 550 may be formed to be relatively narrower in width than other areas according to a design situation of the electronic device 400. In this case, the conductive connecting member 450 may be formed to correspond to the shape of the side member 550 to be attached to the side member 550 or may be deposited on the side member 550 to correspond to the shape of the side member 550.

In some embodiments, referring to FIG. 7A, a second conductive connecting member 450-2 may be positioned at a corner of the electronic device 400. A portion of the side member 550 constituting a corner of the electronic device 400 may be formed to be narrower in width than other areas according to a design situation of the electronic device 400. The second conductive connecting member 450-2 may be formed to correspond to the shape of the side member 550 to be attached to the side member 550 constituting the corner of the electronic device 400. For example, as illustrated in FIG. 7A, the second conductive connecting member 450-2 may include a first area 710 and a second area 720 that is narrower in width than the first area 710. In this case, in the process in which the electric charges accumulated in the electronic device 400 move to the conductive member 540 disposed on the display module 410 (e.g., the display module 160 in FIG. 1, the display 201 in FIG. 2A, or the display 330 in FIG. 3) via the second conductive connecting member 450-2, a bottleneck phenomenon of electric charges may occur in the second area 720 since the second area 720 connected to the first area 710 is narrow. In this case, the conductivity of the accumulated electric charges to the support member 540 disposed in the display module 410 may be reduced. In addition, some of the accumulated electric charge may be conducted to an electronic component and cause damage to the electronic component.

According to various embodiments, a third conductive connecting member 730 may be disposed on the second conductive connecting member 450-2. The third conductive connecting member 730 may be disposed in the second area 720 of the second conductive connecting member 450-2. Since the third conductive connecting member 730 is disposed in the second area 720 of the second conductive connecting member 450-2, the conductive area may be substantially increased by the thickness H of the third conductive connecting member 730. Accordingly, since a path through which accumulated electric charges are movable is increased by the third conductive connecting member 730, the bottleneck phenomenon of electric charges generated in the second area 720 can be resolved.

According to various embodiments, as illustrated in FIG. 7B, in the third conductive connecting member 730, a first conductive layer 740, an insulating layer 760, and a second conductive layer 750 may be stacked in that order. In other embodiments, the third conductive connecting member 730 may have a structure in which a plurality of conductive layers and a plurality of insulating layers are stacked. Here, the insulating layer 760 is formed to be relatively thin compared to the first conductive layer 740 and the second conductive layer 750 such that electric charges can move between the first conductive layer 740 and the second conductive layer 750. For example, referring to FIG. 7B, the thickness c of the insulating layer 760 may be relatively thinner than the thickness a of the first conductive layer 740 and the thickness b of the second conductive layer 750.

In some embodiments, the third conductive connecting member 730 may be disposed such that the first conductive layer 740 comes into contact with the second area 720 of the second conductive connecting member 450-2. The electric charges accumulated in the electronic device 400 may move along the second conductive connecting member 450-2, may pass the first conductive layer 740, the insulating layer 760, and the second conductive layer 750 of the third conductive connecting member 730 in that order, and may be conducted to the conductive support member 540 disposed on the display module 410. In some embodiments, the third conductive connecting member 730 may be the second conductive connecting member 450-2. For example, the second conductive connecting member 450-2 may include a first conductive layer 740, a second conductive layer 750, and an insulating layer 760.

According to various embodiments disclosed herein, in the third conductive connecting member 730, since the insulating layer 760 is disposed between the first conductive layer 740 and the second conductive layer 750, the effect of increasing the surface area of the third conductive connecting member 730 may be obtained. In this case, the resistance of the third conductive connecting member 730 can be lowered to facilitate the flow of electric charges passing through the third conductive connecting member 730. Accordingly, the electric charges accumulated in the electronic device 400 can smoothly move to the conductive support member 540 disposed in the display module 410 along the third conductive connecting member 730.

According to various embodiments, as illustrated in FIG. 7C, the insulating layer 760 may include a hole 760-1 provided to allow the first conductive layer 740 and the second conductive layer 750 to be conductive to each other. Compared to the case in which only the insulating layer 760 is present between the first conductive layer 740 and the second conductive layer 750, when the hole 760-1 is formed, electric charges can move between the first conductive layer 740 and the second conductive layer 750 more smoothly. In some embodiments, referring to FIG. 7C, the insulating layer 760 may include a slit pattern 760-2. In this case, electric charges can move between the first conductive layer 740 and the second conductive layer 750 more smoothly compared to the case in which only the insulating layer 760 is present between the first conductive layer 740 and the second conductive layer 750.

In the above description, it has been described that the third conductive connecting member 730 may be disposed in a partial area of the second conductive connecting member 450-2 for convenience of description, but the third conductive connecting member 730 is not necessarily limited to being disposed on the second conductive connection member 450-2. In some embodiments, since one area of the first conductive connecting member 450-1 is formed to be narrower in width than other areas, a bottleneck of electric charges may occur. In this case, the third conductive connecting member 730 may be disposed in a relatively narrow area among the areas of the first conductive connecting member 450-1 such that the bottleneck phenomenon of electric charges, which may occur in the narrow area of the first conductive connecting member 450-1, can be alleviated or resolved.

Figure 8:
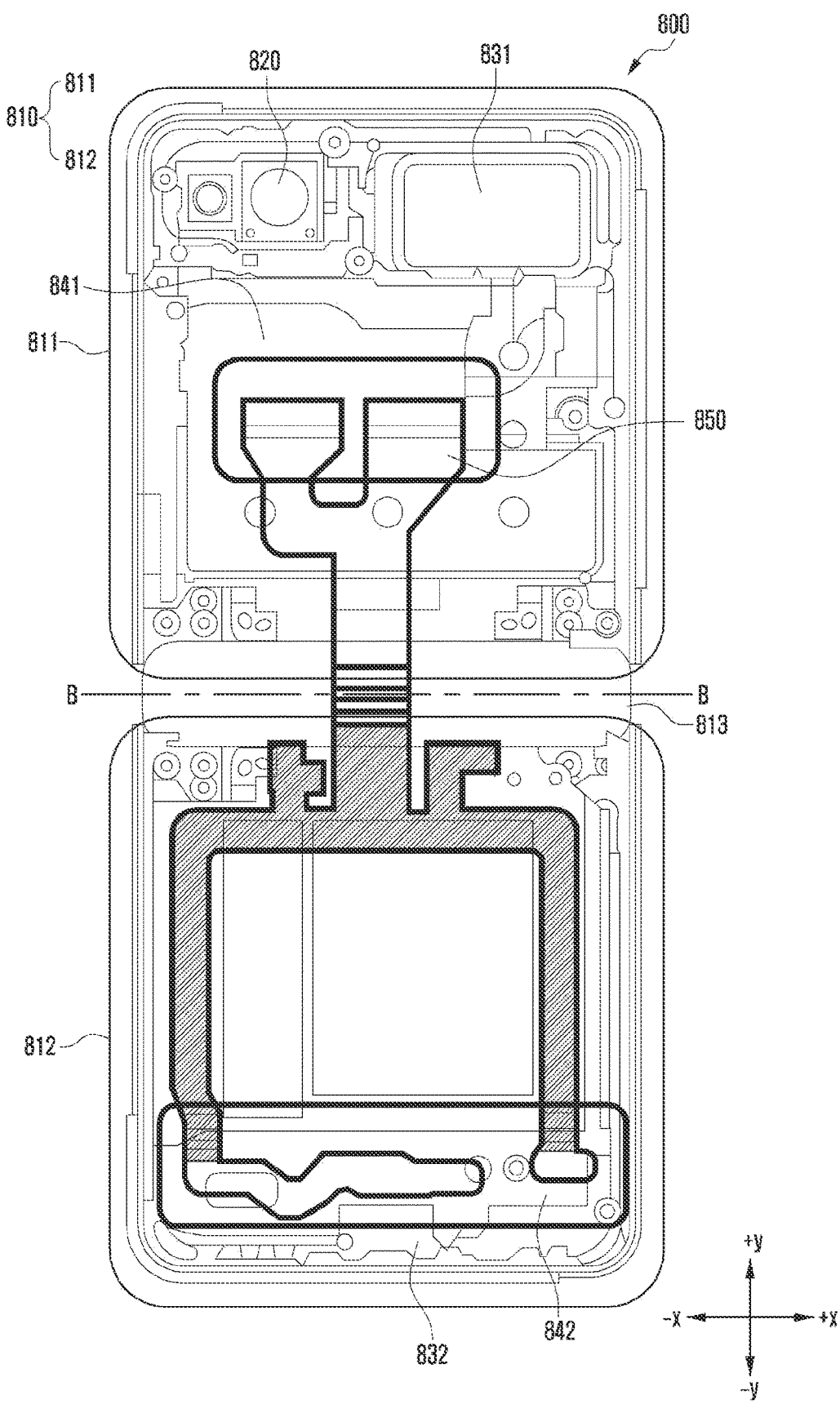
FIG. 8 illustrates a schematic view illustrating components of a foldable electronic device according to various embodiments disclosed herein.

FIG. 8 illustrates a schematic view illustrating components of a foldable electronic device 800 according to various embodiments disclosed herein.

The foregoing description has been made assuming that the electronic device 400 (e.g., the electronic device 101 in FIG. 1, the electronic device 200 in FIG. 2A, or the electronic device 300 of FIG. 3) according to various embodiments disclosed herein is a bar-type electronic device. However, the embodiment disclosed herein is also applicable to a foldable electronic device 800 illustrated in FIG. 8. The electronic device 800 illustrated in FIG. 8 may be an example of the electronic device 101 of FIG. 1, the electronic device 200 of FIG. 2A, the electronic device 300 of FIG. 3, or the electronic device 400 of FIG. 4 described above.

According to various embodiments disclosed herein, as illustrated in FIG. 8, the electronic device 800 may include a first housing 811 (e.g., the housing 210 in FIGS. 2A and 2B) and a second housing 812 (e.g., the housing 210 in FIGS. 2A and 2B) and a hinge device 813. In the first housing 811, a camera module 820 (e.g., the camera module in FIG. 1 or the camera module 205 in FIG. 2A), a first battery (not illustrated) (e.g., the first battery 189 in FIG. 1 or the battery 350 in FIG. 3), a first sound output device 831 (e.g., the sound output module 155 in FIG. 1 or the sound output device 214 in FIG. 2A), and a first printed circuit board 841 electrically connected to electronic components disposed in the first housing 811 may be disposed. Here, the first sound output device 831 disposed in the first housing 811 may be a receiver for calls. The receiver may be used to receive an incoming call. In the second housing 812, a second battery (not illustrated) (e.g., the first battery 189 in FIG. 1 or the battery 350 in FIG. 3), a second sound output device 832 (e.g., the audio module 170 in FIG. 1 or the sound output device 207 in FIG. 2A), and a second printed circuit board 842 electrically connected to electronic components disposed in the second housing 812 may be disposed. Here, the first sound output device 831 and the second sound output device 832 may be connected to a plurality of speaker holes for emitting sound generated by the electronic device 800. In addition, various electronic components may be disposed in at least one of the first housing 811 and the second housing 812. At least some of the above-described components may be omitted, and other components may be added.

According to various embodiments, the first housing 811 and the second housing 812 may be rotatably coupled to each other via a hinge device 813. Here, the hinge device 813 may be a generic term for a hinge structure that rotatably connects the first housing 811 and the second housing 812. For example, the second housing 812 may be rotated and folded relative to the first housing 811.

According to various embodiments, the overall shape of the electronic device 800 may be changed by folding the first housing 811 and the second housing 812 relative to each other. For example, the angle or distance formed by the pair of housings 810 (e.g., the housings 210 in FIGS. 2A and 2B) may vary depending on whether the electronic device 800 is in an unfolded state, a folded state, or an intermediate state in which the first housing 811 and the second housing 812 form a predetermined angle therebetween, so that the overall shape of the electronic device can be changed.

According to various embodiments, the folded state of the electronic device 800 may be the state in which the first housing 811 and the second housing 812 substantially face each other. As described above, when the electronic device 800 is folded, the electronic device 800 is deformed to be compact as a whole, so that the portability of the electronic device 800 can be improved. In addition, in the state in which the electronic device 800 is folded, the portion in which the display module 410 (e.g., the display module 160 in FIG. 1, the display 201 in FIG. 2A, the display 330 in FIG. 3, or the display module 410 in FIG. 4) is exposed to the outside may be reduced. Accordingly, the risk of damage to the display module 410 due to an external impact may be reduced.

According to various embodiments, the first housing 811 and the second housing 812 may be disposed on both sides about the folding axis (e.g., the axis B-B in FIG. 8), and have a substantially symmetrical shape with respect to the folding axis. Here, the folding axis may mean a virtual axis.

According to various embodiments, the pair of housings 810 may be formed in various ways. For example, the housings 810 may be formed by injection molding or die casting. The pair of housings 810 may be formed of various materials. For example, the front cover 320, the rear cover 380, and the side member 218 may be formed of a metal material or a non-metal material. Here, the metal material may include an alloy of aluminum, stainless steel (STS, SUS), iron, magnesium, or titanium, and the non-metal material may include a synthetic resin, ceramic, or engineering plastic. In the pair of housings 810, multiple portions segmented from each other may be connected to each other in various ways. For example, coupling through bonding by an adhesive, bonding through welding, or coupling through bolting may be performed. The shape, material, or forming method of the housings 810 illustrated in FIG. 8 described above is merely an example, and the housings 810 may be variously changed within a range that is capable of being implemented by a person ordinarily skilled in the art.

According to various embodiments, a display module 410 supported by a pair of housings 810 may be disposed on the front surface of the electronic device 800. The display module 410 may include any suitable device capable of displaying visual information. According to some embodiments, at least a portion of the display module 410 may be folded by rotation of the first housing 811 and the second housing 812.

According to various embodiments, the display module 410 may be a flexible display in which at least a partial area is foldable. In some embodiments, the board of the display module 410 may be formed of a flexible material. For example, the board of the display module 410 may be formed of a polymer material, such as polyethylene terephthalate (PET) or polyimide (PI), or an ultra-thin glass (UTG) machined to a very small thickness.

According to various embodiments, as illustrated in FIG. 8, a flexible printed circuit board 850 (e.g., the board 340 of FIG. 3) may electrically connect electronic components disposed in the electronic device 800. For example, the flexible printed circuit board 850 may electrically connect the electronic components disposed in the first housing 811 and the electronic components disposed in the second housing 812.

As illustrated in FIG. 4, the electronic device 800 according to various embodiments disclosed herein may include a frame 420 (e.g., the side bezel structure 218 in FIG. 2A or the side member 310 in FIG. 3) constituting the exterior of the side surface (e.g., the side surface 210C in FIG. 2A) of the electronic device 800. In some embodiments, the frame 420 may be disposed to surround the display module 410 of the electronic device 800. In some embodiments, the frame 420 may be formed of a conductive material such as a metal material. For example, the frame 420 may be formed of a metal material including aluminum (Al).

According to various embodiments, as illustrated in FIG. 4, the frame 420 may include a plurality of first split portions 430. The frame 420 may be physically segmented into a plurality of portions by the first split portions 430. Here, the first split portions 430 may be spaces provided in the frame 420 so that one frame 420 can be segmented into a plurality of portions. In other embodiments, the first split portions 430 may be spaces provided as a plurality of frames 420 are arranged to be spaced apart from each other.

In some embodiments, referring to FIG. 4, the frame 420 may be physically segmented into a first frame 420-1 and second frames 420-2 by the first split portions 430. In some embodiments, the first frame 420-1 may be a portion of a frame 420 that is disposed between corners of the electronic device 800 to constitute the exterior of the electronic device 800. The second frames 420-2 may be portions of the frame 420 that are disposed at the corners of the electronic device 800 and be a part of the frame 420 to constitute the exterior of the electronic device 800.

In some embodiments, the electronic device 800 may include a conductive connecting member 450. When the conductive connecting member 450 is disposed adjacent to the first insulating members 440, a coupling phenomenon may occur between the plurality of frames 420 as described above. In order to prevent this phenomenon, the conductive connecting member 450 may be segmented into a plurality of portions by second split portions 460. For example, referring to FIG. 4, the conductive connecting member 450 may be segmented into a first conductive connecting member 450-1 and second conductive connecting members 450-2 with reference to the second split portions 460. The second split portions 460 may be positioned to correspond to the first split portions 430. For example, when the electronic device 800 is viewed in the +Y direction with reference to FIG. 4, the first split portions 430 and the second split portions 460 may coincide with each other or one of the first split portions 430 and the second split portions 460 may include the other. The first conductive connecting member 450-1 may be at least partially attached to a side member 550 disposed between the frame 420 and the display module 410 to correspond to the first frame 420-1. The second conductive connecting members 450-2 may be attached to the side member 550 to correspond to the second frames 420-2. Since the conductive connecting member 450 is disposed by being segmented with reference to the second split portions 460 corresponding to the first split portions 430, the first insulating members 440 filling the first split portions 430 may not be disposed adjacent to each other. Accordingly, the coupling phenomenon between the plurality of frames 420 can be alleviated or resolved.

According to various embodiments disclosed herein, as illustrated in FIG. 5B, the conductive connecting member 450 may be a path through which accumulated electric charges move to ground. The first conductive connecting member 450-1 may induce the flow of electric charges from the second partition wall portion 550-2 to the frame 420. As described above, the first conductive connecting member 450-1 may extend from the second partition wall portion 550-2 to the first partition wall portion 550-1 to be disposed on the side member 550. A portion of the first conductive connecting member 450-1 may be positioned in the opening 560 provided in the first partition wall portion 550-1. In some embodiments, referring to FIG. 5B, electric charges accumulated outside the electronic device 800 may move into the electronic device 800 through the gap between the side member 550 and the display module 410. The accumulated electric charges may move to the first conductive connecting member 450-1 disposed on the first partition wall portion 550-1 along the first conductive connecting member 450-1 disposed on the second partition wall portion 550-2. Since a portion of the first conductive connecting member 450-1 is positioned adjacent to the opening 560, the accumulated electric charges may be discharged into the air through the opening 560. The electric charges discharged into the air may be conducted to the first frame 420-1, which can be formed of a conductive material. Since the first frame 420-1 is electrically connected to at least one ground, accumulated electric charges may flow to ground. In addition, the first conductive connecting member 450-1 may be a path that conducts accumulated electric charges to the opening 560 so that the electric charges accumulated inside the electronic device 800 according to the operation of an electronic component can be conducted to the first frame 420-1 through the opening 560. Accordingly, since the accumulated electric charges move to ground, the ESD phenomenon caused by the accumulated electric charges can be alleviated or resolved. However, this does not mean that the accumulated electric charges are limited to moving to the opening 560 only through the first conductive connecting member 450-1. In other embodiments, the accumulated electric charges may move to the opening 560 provided in the side member 550 along the second conductive connecting members 450-2 to be discharged into the air through the opening 560. The accumulated electric charges may pass through the opening 560 to be conducted to the second frames 420-2. Since the second frames 420-2 is electrically connected to at least one ground, the accumulated electric charges may flow to ground.

According to various embodiments, the accumulated electric charges may be conducted to the second conductive connecting members 450-2. As described above, since the second conductive connecting members 450-2 are positioned at corners of the electronic device 800 to correspond to the second frames 420-2, the second conductive members 450-2 may be located adjacent to a support member 540 of the display module 410 disposed in an inner area of the bending portion 520 of the display module 410. The second conductive connecting member 450-2 may induce the flow of electric charges to the support member 540. The accumulated electric charges may move along the second conductive connecting member 450-2 and may be conducted to the conductive support member 540 disposed in the display module 410. Since the accumulated electric charges move to the support member 540 electrically connected to ground, the ESD phenomenon caused by the accumulated electric charges may be alleviated or resolved.

According to various embodiments, a third conductive connecting member 730 may be disposed on the second conductive connecting member 450-2. The third conductive connecting member 730 may be disposed in the second area 720 of the second conductive connecting member 450-2. Since the third conductive connecting member 730 is disposed in the second area 720 of the second conductive connecting member 450-2, the conductive area may be substantially increased by the thickness H of the third conductive connecting member 730. Accordingly, since a path through which accumulated electric charges are movable is increased by the third conductive connecting member 730, the bottleneck phenomenon of electric charges generated in the second area 720 can be resolved.

An electronic device 400 (e.g., the electronic device 101 in FIG. 1, the electronic device 200 in FIG. 2A, the electronic device 300 in FIG. 3, or the electronic device 800 in FIG. 8) according to various embodiments disclosed herein may include a display module 410 (e.g., the display module 160 in FIG. 1, the display 201 in FIG. 2A, or the display 330 in FIG. 3), a connecting member 520, 530 including a bending portion 520 connected to a display panel of the display module and extending toward a rear surface (e.g., the surface oriented in the −Z direction with reference to FIG. 5B) of the display module, and a protective layer 530 formed of an insulating material to cover the bending portion, a printed circuit board (e.g., the board 340 in FIG. 3) disposed on the rear surface of the display module and connected to the display module by the connecting member, a frame 420 (e.g., the side bezel structure 218 in FIG. 2A) disposed to surround at least a portion of the display module and formed of a conductive material, a side member 550 including a first partition wall portion 550-1 disposed between the frame and the display module to be spaced apart from the frame and a second partition wall portion 550-2 disposed to be spaced apart from the display module and covering at least a portion of an outer periphery of the display module, at least one opening 560 provided in the first partition wall portion, and a first conductive connecting member 450-1 extending from the second partition wall portion to the first partition wall portion, at least a portion of the first conductive connecting member being located in the opening and at least a portion of the conductive connecting member being disposed on the side member to face the connecting member.

In addition, the frame may include a first frame 420-1, at least a portion of which faces the connecting member of the display module, and a second frame 420-2 segmented from the first frame by a split portion (e.g., the first split portion 430 in FIG. 4).

The electronic device may further include a second conductive connecting member 450-2 disposed on the side member to correspond to the second frame.

In addition, a flow of electric charges may be induced from the second partition wall portion to the frame by the first conductive connecting member.

In addition, the printed circuit board may be electrically connected to at least one ground disposed in the electronic device, and the frame may be electrically connected to the printed circuit board.

In addition, the display module may include a support member 540 formed of a conductive material and connected to at least one ground disposed in the electronic device.

In addition, a flow of electric charges may be induced to the support member by the second conductive connecting member.

In addition, the first conductive connecting member may include a pad portion 610 disposed in the opening provided in the side member.

In addition, the pad portion of the first conductive connecting member may fill the opening provided in the side member.

The electronic device may further include an auxiliary connecting member 620 formed of a conductive material and disposed on the first partition wall portion to cover at least a portion of the opening provided in the side member in an area between the frame and the first partition wall portion.

The electronic device may further include a first insulating member 440 formed of an insulating material and filling the split portion provided in the frame.

The electronic device may further include a second insulating member 570 formed of an insulating material and disposed between the second partition wall portion and the display module.

In addition, the second conductive connecting member may include a first area 710 and a second area 720 that is narrower in width than the first area 710.

The electronic, device may further include a third conductive connecting member 730 disposed in the second area 720, wherein the third conductive connecting member may include a first conductive layer 740, a second conductive layer 750, and an insulating layer 760 disposed between the first conductive layer 740 and the second conductive layer 750.

In addition, the insulating layer may include a hole (e.g., the hole 760-1 in FIG. 7C or a slit pattern 760-2 in FIG. 7C) formed to allow the first conductive layer 740 and the second conductive layer 750 to be conductive to each other.

An electronic device 400 (e.g., the electronic device 101 in FIG. 1, the electronic device 200 in FIG. 2A, the electronic device 300 in FIG. 3, or the electronic device 800 in FIG. 8) according to various embodiments disclosed herein may include a display module 410 (e.g., the display module 160 in FIG. 1, the display 201 in FIG. 2A, or the display 330 in FIG. 3), a connecting member 520, 530 including a bending portion 520 connected to a display panel of the display module and extending toward a rear surface the surface oriented in a −Z direction with reference to FIG. 5B) of the display module, and a protective layer 530 formed of an insulating material to cover the bending portion, a printed circuit board (e.g., the board 340 in FIG. 3) disposed on the rear surface of the display module and connected to the display module by the connecting member, a frame 420 (e.g., the side bezel structure 218 in FIG. 2A) formed of a conductive material and disposed to surround at least a portion of the display module, wherein the frame includes a first frame 420-1, at least a portion of which faces the connecting member of the display module, and a second frame 420-2 segmented from the first frame by a split portion (e.g., the first split portion 430 in FIG. 4), a side member 550 including a first partition wall portion 550-1 disposed between the frame and the display module to be spaced apart from the frame and a second partition wall portion 550-2 disposed to be spaced apart from the display module and covering at least a portion of an outer periphery of the display module, at least one opening 560 provided in the first partition wall portion, and a first conductive connecting member 450-1 extending from the second partition wall portion to the first partition wall portion, at least a portion of the first conductive connecting member being located in the opening and at least a portion of the conductive connecting member being disposed on the side member to face the connecting member.

The electronic device may further include a second conductive connecting member 450-2 disposed on the side member to correspond to the second frame.

In addition, a flow of electric charges may be induced from the second partition wall portion to the frame by the first conductive connecting member.

In addition, the display module may include a support member 540 formed of a conductive material and connected to at least one ground disposed in the electronic device.

In addition, a flow of electric charges may be induced to the support member by the second conductive connecting member.

The embodiments disclosed in the specification and drawings are provided merely to easily describe the technical features of the disclosure according to the embodiments disclosed herein and to help understanding of the embodiments disclosed herein, and are not intended to limit the scope of the embodiments disclosed herein. Therefore, the scope of the various embodiments disclosed herein should be construed in such a manner that, in addition to the embodiments disclosed herein, all changes or modifications derived from the technical idea of the various embodiments are included in the scope of the various embodiments disclosed herein.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
    a display module including a display panel;
    a frame forming an exterior side surface of the electronic device, the frame including a conductive frame portion;
    a side member including a first portion disposed between the frame and the display module and a second portion covering an edge portion of the display module;
    a first conductive member attached to the side member between the display module and the side member so as to extend from a surface of the second portion to a surface of the first portion; and
    at least one slit formed at the first portion of the side member and facing the conductive frame portion,
    wherein the first conductive member is located in or adjacent to the slit.

2. The electronic device of claim 1, further comprising:
    a connecting member including a bending portion connected to a display panel of the display module and extending toward a rear surface of the display module, and a protective layer formed of an insulating material to cover the bending portion,
    wherein the frame includes a first frame, at least a portion of which faces the connecting member of the display module, and a second frame that is segmented from the first frame by a split portion.

3. The electronic device of claim 2, further comprising:
    a second conductive member disposed on the side member to correspond to the second frame.

4. The electronic device of claim 1, wherein an electrical charge is induced from the first conductive member at the second portion of the side member to the frame via the slit.

5. The electronic device of claim 2, further comprising:
    a printed circuit board disposed on the rear surface of the display module and connected to the display module by the connecting member,
    wherein the printed circuit board is electrically connected to at least one ground disposed in the electronic device, and the frame is electrically connected to the printed circuit board.

6. The electronic device of claim 3, wherein the display module includes a support member formed of a conductive material and connected to at least one ground disposed in the electronic device.

7. The electronic device of claim 6, wherein a flow of electric charges is induced to the support member by the second conductive member.

8. The electronic device of claim 1, wherein the first conductive member includes a pad portion disposed in the slit of the side member.

9. The electronic device of claim 8, wherein the pad portion of the first conductive member fills the slit of the side member.

10. The electronic device of claim 1, further comprising:
    an auxiliary connecting member formed of a conductive material and disposed on the first portion to cover at least a portion of the slit formed in the side member in an area between the frame and the first portion.

11. The electronic device of claim 2, further comprising:
    a first insulating member formed of an insulating material and provided to fill the split portion provided in the frame.

12. The electronic device of claim 1, further comprising:
    a second insulating member formed of an insulating material and disposed between the second portion and the display module.

13. The electronic device of claim 3, wherein the second conductive member includes a first area and a second area that is narrower in width than the first area.

14. The electronic device of claim 13, further comprising:
    a third conductive member disposed in the second area,
    wherein the third conductive member includes a first conductive layer, a second conductive layer, and an insulating layer disposed between the first conductive layer and the second conductive layer.

15. The electronic device of claim 14, wherein the insulating layer includes a hole provided to allow the first conductive layer and the second conductive layer to be conductive to each other.

16. An electronic device comprising:
    a display module;
    a connecting member including a bending portion connected to a display panel of the display module and extending toward a rear surface of the display module, and a protective layer formed of an insulating material to cover the bending portion;
    a printed circuit board disposed on the rear surface of the display module and connected to the display module by the connecting member;
    a frame forming an exterior side surface of the electronic device, the frame including a conductive frame portion, wherein the frame includes a first frame, at least a portion of which faces the connecting member of the display module, and a second frame segmented from the first frame by a split portion;
    a side member including a first portion disposed between the frame and the display module and a second portion covering an edge portion display module; and
    a first conductive member attached to the side member between the display module and the side member so as to extend from a surface of the second portion to a surface of the first portion,
        at least one slit formed at the first portion of the side member and facing the conductive frame portion,
    wherein the first conductive member is located in or adjacent to the slit.

17. The electronic device of claim 16, further comprising:
    a second conductive member disposed on the side member to correspond to the second frame.

18. The electronic device of claim 16, wherein a flow of electric charges is induced from the second portion to the frame by the first conductive member.

19. The electronic device of claim 17, wherein the display module includes a support member formed of a conductive material and connected to at least one ground disposed in the electronic device.

20. The electronic device of claim 19, wherein a flow of electric charges is induced to the support member by the second conductive member.

* * * * *